United States Patent
Yamauchi et al.

(10) Patent No.: US 7,348,591 B2
(45) Date of Patent: Mar. 25, 2008

(54) SWITCH ELEMENT, MEMORY ELEMENT AND MAGNETORESISTIVE EFFECT ELEMENT

(75) Inventors: Takashi Yamauchi, Kanagawa (JP); Chika Tanaka, Kanagawa (JP); Hideyuki Sugiyama, Kanagawa (JP); Atsuhiro Kinoshita, Kanagawa (JP); Junji Koga, Kanagawa (JP); Yuichi Motoi, Kanagawa (JP); Yoshihiko Nakano, Kanagawa (JP); Seiichi Suenaga, Kanagawa (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 11/502,432

(22) Filed: Aug. 11, 2006

(65) Prior Publication Data

US 2007/0037414 A1 Feb. 15, 2007

(30) Foreign Application Priority Data

Aug. 12, 2005 (JP) .............................. 2005-234515

(51) Int. Cl.
 *H01L 29/06* (2006.01)
(52) U.S. Cl. ................................ 257/9; 257/2; 977/762
(58) Field of Classification Search .................... 257/2, 257/9; 438/800; 977/762
See application file for complete search history.

(56) References Cited

U.S. PATENT DOCUMENTS

| 2003/0042562 A1* | 3/2003 | Giebeler et al. ............. 257/421 |
| 2003/0122208 A1* | 7/2003 | Sato et al. .................. 257/427 |
| 2004/0071951 A1* | 4/2004 | Jin .............................. 428/323 |
| 2004/0127130 A1* | 7/2004 | Yi et al. ....................... 442/376 |
| 2006/0108906 A1* | 5/2006 | Gosain et al. ............... 313/309 |
| 2006/0148370 A1* | 7/2006 | Kadono et al. ................ 445/51 |
| 2006/0204794 A1* | 9/2006 | Kikuchi et al. ........... 428/836.2 |

FOREIGN PATENT DOCUMENTS

JP 11-139815 * 5/1999

OTHER PUBLICATIONS

Rueckes, et al., "Carbon Nanotube—Based Nonvolatile Random Access Memory for Molecular Computing", SCIENCE, vol. 289, pp. 94-97, (Jul. 7, 2000).
Treacy, et al., "Exceptionally high Young's modulus observed for individual carbon nanotubes", NATURE, vol. 381, pp. 678-380, (Jun. 20, 1996).
Murakami, et al., "Field emission from well-aligned, patterned, carbon nanotube emitters", Applied Physics Letters, vol. 76, No. 13, pp. 1776-1778, (Mar. 27, 2000).

* cited by examiner

*Primary Examiner*—Jerome Jackson
*Assistant Examiner*—Jami M Valentine
(74) *Attorney, Agent, or Firm*—Finnegan, Henderson, Farabow, Garrett & Dunner, L.L.P.

(57) ABSTRACT

A switch element includes a substrate; a plurality of carbon nanotubes provided upright on the substrate; magnetic particles arranged at tip ends of the carbon nanotubes respectively; and a plurality of conductive layers formed between base ends of the carbon nanotubes and the substrate. A switching operation of the switching element is performed in such a manner that the carbon nanotubes or the magnetic particles are brought into contact with each other according to an electrical potential between the conductive layers, and the carbon nanotubes are separated from each other when an electrical current flows through the carbon nanotubes with the carbon nanotubes or the magnetic particles brought into contact with each other.

9 Claims, 19 Drawing Sheets

0 STATE

1 STATE

[DELETING, READING]

SWITCH ELEMENT, MEMORY ELEMENT AND MAGNETORESISTIVE EFFECT ELEMENT

CROSS-REFERENCE TO RELATED APPLICATIONS

This application is based upon and claims the benefit of priority from the prior Japanese Patent Application No. 2005-234515, filed on Aug. 12, 2005; the entire contents of which are incorporated herein by reference.

BACKGROUND OF THE INVENTION

1. Field of the Invention

The present invention relates to a switch element, a memory element and a magnetoresistive effect element which use carbon nanotube.

2. Description of the Related Art

Simply, the most notable feature of carbon nanotube is a cylinder made of graphite having a hollow portion. The carbon nanotube can be roughly divided into a single-walled carbon nanotube (CNT; SWCNT) of a one bar shape, and a multi-walled carbon nanotube (Multi-walled CNT; MWCNT) having a concentrically nested structure. Basically, a great difference between them is a difference in diameter, and the diameter of the single-walled CNT is several nm or less, and the diameter of the multi-walled CNT is several nm to several dozens nm. An inner diameter of the multi-walled CNT is generally about ⅓ of the outer diameter, but as the inner diameter is closer to that of the single-walled CNT, a ratio of the inner diameter to the outer diameter is closer to 1.

The feature of the single-walled CNT is that a CNT having metallic property and a CNT having semiconductor property are present depending on a difference in the structure. Further, as to the single-walled CNT, several experiments have been conducted in which a band gap is controlled and single-walled CNTs having different electric property are jointed so that a transistor of a nanoscale is realized.

On the other hand, the multi-walled CNT basically has metallic property. Carbon nanotubes generally-have small influence of scattering due to the presence of defects and impurities in the carbon nanotube, and its electric resistance is lower than that of copper. For this reason, the carbon nanotubes are expected also as interconnection with nm diameter whose resistance is low.

As one application of the carbon nanotubes mentioned above, the application to electronic devices is very effective. However, a serious problem which should be solved in order to realize this application is the following two points.

The first is the problem of contact between a carbon nanotube and metal which is necessary for wiring from an element manufactured by the carbon nanotube. Normally when the metal is allowed to adhere to the carbon nanotube by the vacuum evaporation method, contact resistance therebetween becomes very high. When the element itself becomes small, the contact resistance conceals the resistance of the entire element, and thus the element property is significantly deteriorated. For this reason, it is one of industrially very important problems to select metal which realizes the satisfactory contact with carbon nanotubes.

The second is that even if a single electronic device manufactured by carbon nanotubes is realized, it is an important problem to realize mass-production of carbon nanotubes in order to integrate them. In the present situation, a main method of manufacturing a carbon nanotube includes an arc discharge method and a chemical vapor deposition (CVD) method.

In the arc discharge method, simply, carbon rods used for an electrode are vaporized by discharge, and a carbon nanotube is taken out from collected soot. In this method, generally a very pure carbon nanotube can be taken out, but the step of replacing a carbon rod is required, and thus this method is not suitable for the mass production.

On the other hand, the CVD method is a method of manufacturing carbon nanotube by decomposing hydrocarbon gas over a metal catalyst (Co, Ni, Fe or the like). In this method, the purity is inferior to that in the arc discharge method, but this is excellent from the viewpoint of mass production.

In the present situation, however, neither a method of selectively growing a carbon nanotube having a specific structure nor a method of selectively taking out only a carbon nanotube having a specific structure from manufactured carbon nanotubes are developed. Therefore, this constitutes a large barrier to the mass production of transistors using single-walled CNTs. That is, in order to industrially apply electronic devices using carbon nanotubes, it is necessary to solve the manufacturing problems mentioned above or formulate a device which does not have to select a carbon nanotube having a specific structure.

Meanwhile, an attention is paid to carbon nanotubes due to their high mechanical strength, and it is known that its Young's modulus is about 1 TPa. For this reason, carbon nanotubes are tried to be utilized as probes of scanning probe microscopes by utilizing their strength. Recently, memory elements which utilize the strength of the carbon nanotube are proposed as described in Thomas Rueckes, et al., "Carbon Nanotube-Based Nonvolatile Random Access Memory for Molecular Computing", Science, vol. 289, 94-97, 7 Jul. 2000".

In this memory element, one-bit element is basically composed of a structure that two electrodes sandwich a bundle of carbon nanotubes. In principle, the bundle of the carbon nanotubes is brought into contact with any one of electrodes (electrode 1) by an electrostatic attracting force which is generated by applying a voltage between the carbon nanotubes and the electrode 1. This state is maintained by their van der Waals force so that a switching operation having a memory function is realized.

Further, when a voltage is applied between the other electrode (electrode 2) and the carbon nanotubes, the electrode 1 is separated from the bundle of the carbon nanotubes by electrostatic attracting force at this time, so that the memory can be erased. When resistance between the electrode 1 and the carbon nanotubes is measured, the state can be read. It goes without saying that the element utilizes high endurance (mechanical strength) with respect to the repeating operation of contact and separation of the carbon nanotubes. Basically, since a bundle of carbon nanotubes having arbitrary structure may be manufactured, the problem of the mass production mentioned above can be avoided.

When, however, the electrode 1 is formed on a substrate and a bundle of the carbon nanotubes is provided thereon, it is necessary to form the electrode 2 so as to float three-dimensionally, and this is very difficult. When one-bit element is tried to be small in order to achieve high integration, the bundle of the carbon nanotubes should be small. In such a situation, it is necessary to make the bundle of the carbon nanotubes uniform in all the elements, but it is very difficult to realize this state using the current technique in a nano-level. Further, a driving voltage for contact with the electrodes rises due to the strength of the carbon nanotubes, and this causes deterioration in the element property itself.

SUMMARY OF THE INVENTION

According to one aspect of the present invention, a switch element includes a substrate; a plurality of carbon nanotubes provided upright on the substrate; magnetic particles arranged at tip ends of the carbon nanotubes respectively; and a plurality of conductive layers formed between base ends of the carbon nanotubes and the substrate; wherein a switching operation is performed in such a manner that the carbon nanotubes or the magnetic particles are brought into contact with each other according to an electrical potential between the conductive layers, and the carbon nanotubes are separated from each other when an electrical current flows through the carbon nanotubes with the carbon nanotubes or the magnetic particles brought into contact with each other.

According to another aspect of the present invention, a switch element includes a semiconductor substrate; a semiconductor conductive layer prepared by doping an impurity in a surface layer of the semiconductor substrate; a plurality of carbon nanotubes provided upright on the semiconductor conductive layer; magnetic particles arranged at tip ends of the carbon nanotubes respectively; a conductive layer formed between a base end of the carbon nanotube and the semiconductor conductive layer with being insulated from the semiconductor conductive layer; and a magnetic conductive layer, whose magnetizing direction is fixed, formed between a base end of the other carbon nanotube and the semiconductor conductive layer with being insulated from the conductive layer; wherein a switching operation is performed in such a manner that the carbon nanotubes or the magnetic particles are brought into contact with each other according to an electrical potential between the conductive layers, and the carbon nanotubes are separated from each other when an electrical current flows through the carbon nanotubes with the carbon nanotubes or the magnetic particles brought into contact with each other.

According to still another aspect of the present invention, a memory element includes a plurality of the switch elements.

According to still another aspect of the present invention, a magnetoresistive effect element includes a substrate; a plurality of carbon nanotubes provided upright on the substrate; magnetic particles arranged at tip ends of the carbon nanotubes respectively; a plurality of conductive layers formed between base ends of the carbon nanotubes and the substrate; and an insulating layer intervened between the carbon nanotubes; wherein a change in an external magnetic field is detected by sensing a tunnel current flowing between the conductive layers via the insulating layer.

DETAILED DESCRIPTION OF THE INVENTION

The most preferred embodiments of a switch element, a magnetoresistive effect element and a memory element are explained in detail below with reference to the accompanying drawings. The present invention is not limited to the following explanation, and the invention can be suitably varied without departing from the scope of the present invention.

Figure 1A:
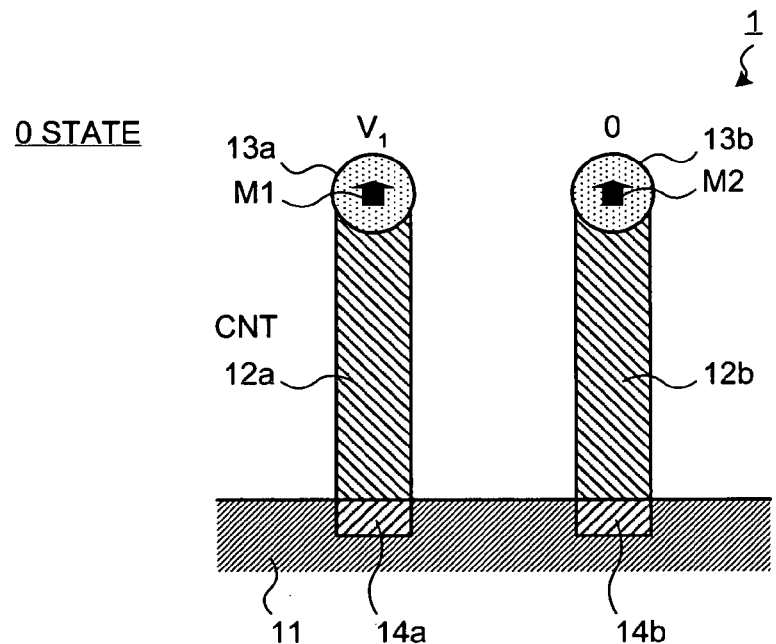
FIG. 1A is a sectional view typically illustrating a schematic constitution of a switch element according to a first embodiment.

FIG. 1A is a sectional view illustrating a schematic constitution of a switch element 1 according to a first embodiment. As shown in FIG. 1A, the switch element 1 of this embodiment is a switch element using carbon nanotubes. The switch element 1 is composed of a substrate 11, a pair of carbon nanotubes 12a and 12b which are provided upright on the substrate 11, magnetic particles 13a and 13b which are arranged on tip ends of the carbon nanotubes 12a and 12b, respectively, and conductive layers 14a and 14b which are formed into an insulating state between base ends of the carbon nanotubes 12a and 12b and the substrate 11.

As the substrate 11, an insulating substrate or a semiconductor substrate can be used, and for example, a silicon substrate can be used. The carbon nanotubes 12a and 12b are composed of single-walled or multi-walled carbon nanotubes which are provided upright on the substrate 11, namely, are grown in an approximately vertical direction to the in-plane direction of the substrate 11. An angle of the carbon nanotube 12 with respect to the in-plane direction of the substrate is allowed within a range where it can function as the switch element. Further, hereinafter, the carbon nanotubes are collectively called as the carbon nanotube 12 occasionally.

The magnetic particles 13a and 13b are catalytic metal for growing carbon nanotubes, and also means for maintaining contact between carbon nanotubes. Metal particles such as iron (Fe), nickel (Ni) and cobalt (Co) can be used. The magnetic particles are hereinafter collectively called as the magnetic particle 13 occasionally. As the conductive layers 14a and 14b, any layers such as a high-doped semiconductor conductive layer and a metal layer may be used as long as such a layer can be utilized as wiring.

In the switch element 1 of this embodiment having the above constitution, a difference in electrical potential is generated between the conductive layers 14a and 14b, so that the carbon nanotubes 12a and 12b can be brought into contact with each other. An electrical current is allowed to flow between the carbon nanotubes 12a and 12b which are in the contact state so that they can be separated from each other. These operations enable the switching operation to be performed.

Figure 1B:
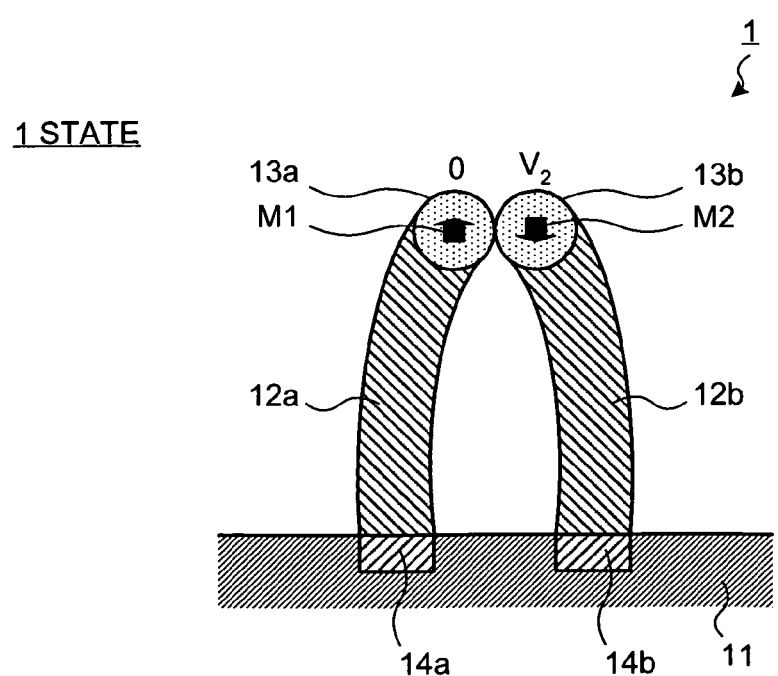
FIG. 1B is a sectional view explaining an operating state of the switch element according to the first embodiment.

That is, when a voltage is applied between the two conductive layers 14a and 14b, an electrostatic attracting force is exerted between the carbon nanotubes 12a and 12b. When the electrostatic attracting force becomes stronger than an elastic force of the carbon nanotubes 12a and 12b, the carbon nanotubes 12a and 12b can be brought into contact with each other. At the time of the contact between the carbon nanotubes 12a and 12b, it is preferable that the magnetic particles 13a and 13b arranged on the tip ends of the carbon nanotubes 12a and 12b are also brought into contact with each other. When the magnetic particles 13a and 13b are once sufficiently close to each other, a magnetizing direction M1 of the magnetic particle 13a and a magnetizing direction M2 of the magnetic particle 13b, which face the same direction in an initial state as shown in FIG. 1A, face opposite directions so as to become stable as shown in FIG. 1B.

Further, electric charges which charge the carbon nanotubes 12a and 12b and the magnetic particles 13a and 13b disappear instantly upon contacting with each other, but when magnetic dipolar moment interaction (attraction force) which is generated between the magnetic particles 13a and 13b is stronger than the elastic force of the carbon nanotubes 12a and 12b, the contact state is maintained.

On the contrary, when a voltage is applied between the conductive layers 14a and 14b in the contact state, an electrical current flows in the carbon nanotubes 12a and 12b, a spin injection occurs between the magnetic particles 13a and 13b, and the magnetizing directions M1 and M2 of the magnetic particles 13a and 13b are aligned. For this reason, the magnetic dipolar moment interaction (attraction force) between the magnetic particles 13a and 13b becomes repulsive, and the elastic force of the carbon nanotubes 12a and 12b acts. As a result, the two carbon nanotubes 12a and 12b are separated from each other.

This is the operating principle of the switch element 1 using the carbon nanotubes according to this embodiment. In order to realize the switch element 1 using the carbon nanotubes of this embodiment, a voltage for generating the electrostatic attraction force stronger than the elastic force of the carbon nanotubes 12a and 12b should be applied between the conductive layers 14a and 14b. Needless to say, the elastic force varies greatly according to the constitution of the single-walled CNTs and the multi-walled CNTs.

Figure 2:
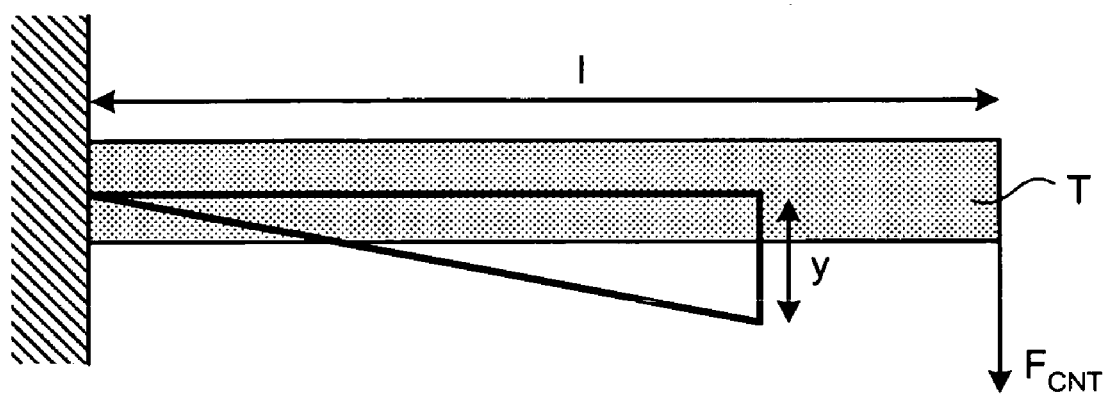
FIG. 2 is a schematic diagram explaining a constitution in the case where a carbon nanotube whose one end is fixed is bent.

In general, as shown in FIG. 2, when deflection (displacement) at the time of applying a force $F_{CNT}$ to the other end of the carbon nanotube T whose one end is fixed is designated by y, a relationship between y and $F_{CNT}$ is expressed by the following formula (1) (Nature, vol. 381, 678, (1996)).

$$\langle y^2 \rangle = 0.4243 \frac{l^3 k_B T}{Y(a^4 - b^4)} \tag{1}$$

In the formula (1), $\langle y^2 \rangle$ designates square means, $k_B$ designates Boltzmann constant $(=1.38 \times 10^{-23}$ JK$^{-1})$, T designates an absolute temperature $(=300$ K), Y designates Young's modulus of the carbon nanotube $(=1$ TPa), and 1 designates a length of the carbon nanotube.

Figure 3:
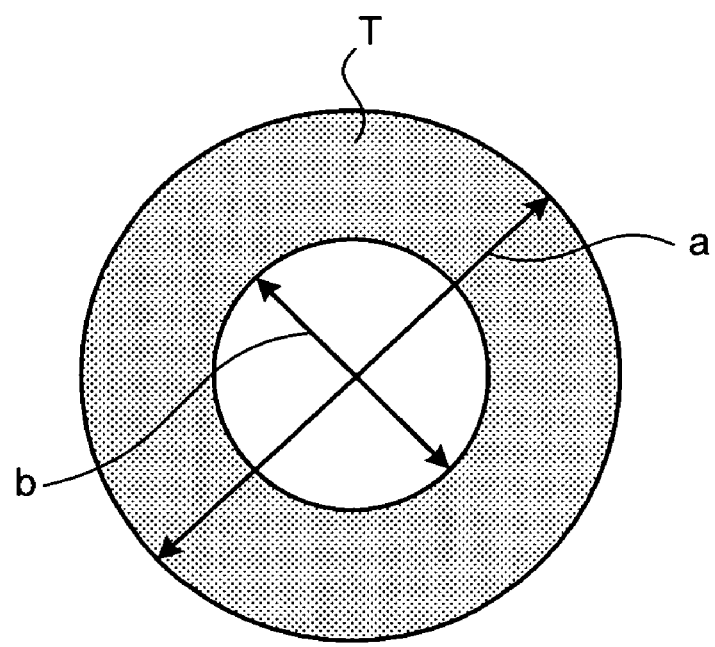
FIG. 3 is a sectional view of the carbon nanotube in a radius direction.

FIG. 3 is a sectional view in a radius direction of the carbon nanotube. As shown in FIG. 3, it is known that an outer diameter of the carbon nanotube is about three times as large as an inner diameter b of the carbon nanotube in the case of the multi-walled CNT.

Further, the displacement y is generally expressed by the following formula (3) using a bending moment expressed by the following formula (2):

$$I = \frac{\pi}{64}(a^4 - b^4) \tag{2}$$

$$y = \frac{F_{CNT} l^3}{3YI} \tag{3}$$

According to the formulas (1) to (3), the elastic force $F_{CNT}$ of the carbon nanotube is expressed by using only a structure constant of the carbon nanotube according to the following formula (4):

$$F_{CNT} = \frac{3\pi}{64} \sqrt{\frac{0.423 Y \cdot k_B T \cdot (a^4 - b^4)}{l^3}} \tag{4}$$

Further, the electrostatic attraction force $F_{ELE}$ with respect to the potential difference V generated between the two magnetic particles is expressed by the following formula (5):

$$F_{ELE} = 4\pi \epsilon_0 V^2 \tag{5}$$

In the formula (5), $\epsilon_0$ designates dielectric constant of vacuum, and is $8.85 \times 10^{-12}$ F/m.

When a voltage V for making $F_{ELE}$ larger than $F_{CNT}$ is applied between the conductive layers 14a and 14b, the carbon nanotubes 12a and 12b can be brought into contact with each other, and this voltage is designated by $V_{th}$ in this invention.

In order to realize the switch element 1 of this embodiment, it is necessary to retain the contact state of the carbon nanotubes 12a and 12b. A retentive power for retaining the contact state of the carbon nanotubes 12a and 12b is the magnetic dipolar moment interaction $F_{SPIN}$ generated between the magnetic particles 13a and 13b having different magnetizing directions. This can be generally expressed by the following formula (6):

$$F_{SPIN} = \frac{1}{4\pi\mu_0} \frac{m^2}{r^4} \quad (6)$$

In the formula (6), m designates a magnetic dipolar moment, and is expressed by a product of magnetization M and a volume of the magnetic particles. The value of the magnetization M is 1.79 W/m² in the case of cobalt, and is 0.69 W/m² in the case of nickel. Further, $\mu_0$ designates magnetic permeability of vacuum (=1.26×10⁻⁶ H/m), and γ designates a distance between the magnetic particles.

The magnetic particles arranged on the carbon nanotubes are formed by using FIB-CVD (Focused Ion Beam-Chemical Vapor Deposition) method, so as to be basically capable of formed into an arbitrary shape. However, when the switch element 1 of this embodiment is manufactured, a chemical vapor deposition method (CVD method) is more suitably used. As a catalyst of the CVD method, magnetic metal such as iron (Fe), cobalt (Co) or nickel (Ni) can be used. The particles of the magnetic metal are arranged on the substrate or a magnetic layer is prepared in the substrate and grown them by the CVD method. As a result, the carbon nanotube in a state that the magnetic particle is buried at the tip end is grown (Appl, Phys. Lett., vol. 76, No. 13, 1777 (2000)). The magnetic particles buried in the carbon nanotubes have a size which is approximately the same as the outer diameter of the carbon nanotubes at the tip ends thereof, and the magnetic particles are buried in the inner diameter in inner portions of the carbon nanotubes. In this invention, this is taken into consideration, and the magnetic dipolar moment of the magnetic particles arranged on the tip ends of the carbon nanotubes is expressed by the following formula (7):

$$m = M\pi a^2 h/4 \quad (7)$$

In the formula (7), the magnetic particles are approximated as a cylinder, and a height h of the carbon nanotubes is set to 20 nm. At this time, if the magnetic particles have the magnetic dipolar moment m for making $F_{SPIN}$ larger than $F_{CNT}$, the contact state between the magnetic particles can be maintained.

In order to realize the switch element 1 according to this embodiment, the carbon nanotubes 12a and 12b which are kept to contact with each other should be separated from each other. For this reason, in the present embodiment, the electrical current is allowed to flow between the conductive layers 14a and 14b, so that the spin injection is carried out between the magnetic particles 13a and 13b. Since the magnetizing directions of the magnetic particles 13a and 13b are aligned with each other due to the spin injection, repulsive magnetic dipolar moment interaction is generated between the magnetic particles 13a and 13b. Further, the carbon nanotubes 12a and 12b which are kept to contact with each other can be separated from each other by the elastic force of the carbon nanotubes 12a and 12b. Current density which are necessary for causing the spin injection differs according to the size of the magnetic particles and the strength of the retention force, but should be generally 10⁶ A/cm² or more. On the contrary, when the current density is not more than 10⁶ A/cm², it is considered that the spin injection does not occur between the magnetic particles.

According to the formulas (4) to (7), it is possible to design the structure of the carbon nanotubes which enables the operation of the switch element 1 according to this embodiment. In this embodiment, according to FIGS. 1A and 1B, a state that the carbon nanotubes 12a and 12b contact with each other is defined as "1" state, and a state that they are separated from each other is defined as "0" state.

Bringing into the "1" state is defined as "input" and a voltage for "input" is designated by "$V_1$", needless to say, a relationship: $V_1 > V_{th}$ should hold. Meanwhile, bringing into the "0" state is defined as "delete" and a voltage for "delete" is designated by "$V_2$".

The length l of the carbon nanotubes is 100 nm, a=3b (a: the outer diameter of the carbon nanotubes, b: the inner diameter of the carbon nanotubes), $V_{th}$=0.5 V and $V_1$=1.5 V. In this case, results of calculating changes in the elastic force $F_{CNT}$ of the carbon nanotubes, the magnetic dipolar moment interaction $F_{SPIN}$ and the electrostatic attraction force $F_{ELE}$ with respect to the outer diameter a of the carbon nanotubes are shown in FIG. 4.

Figure 4:
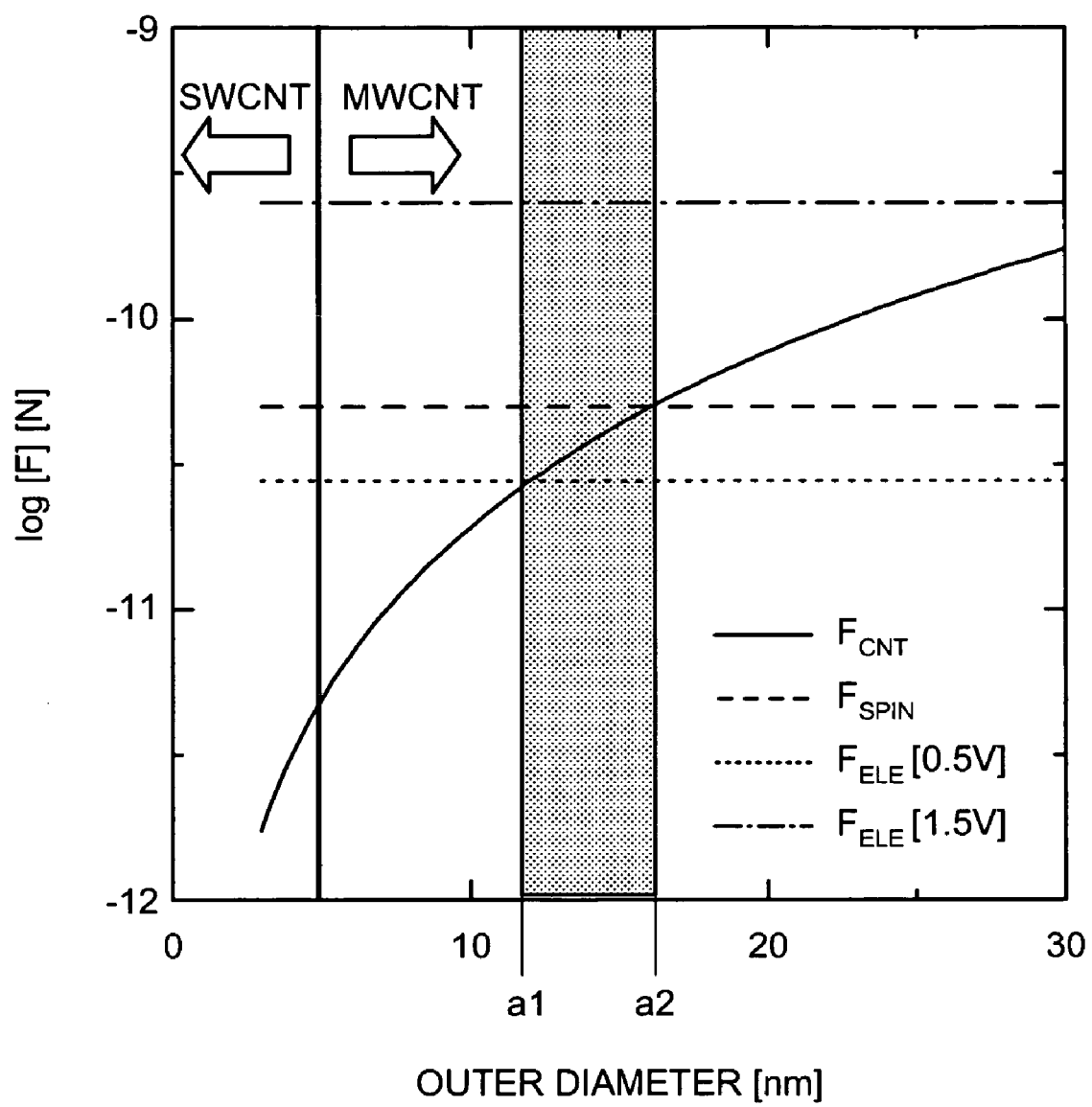
FIG. 4 is a characteristic diagram illustrating a relationship between a force exerted between the carbon nanotubes and the outer diameter of the carbon nanotubes.

As is clear from FIG. 4, when the outer diameter of the carbon nanotubes is set within a range of "a1 to a2", the carbon nanotubes which are brought into contact with each other by the voltage $V_1$ can be retained by the magnetic dipolar moment interaction. For example, when $V_2$ (the voltage for deleting)=1 V, the current density which is not less than 10⁶ A/cm² flows in the magnetic particles via the carbon nanotubes, so that the spin injection can be caused.

Since the switching element of this embodiment utilizes the high mechanical strength of the carbon nanotubes, the switch element has high durability against the repeating operation of contact and separation of the carbon nanotubes, so that the switch element having excellent durability is realized.

According to the switch element of this embodiment, when an electrical potential difference is generated between the conductive layers, the on and off operations of the switch (contact and separation between the carbon nanotubes) are switched by using the electrostatic attraction force generated on the carbon nanotubes and also the magnetic dipolar moment interaction generated between the magnetic particles. For this reason, the switch operation can be performed securely.

According to the switch element of this embodiment, since the electrode is arranged on the substrate and thus the electrode does not have to be arranged three-dimensionally, the switch element can be constituted by the simple structure. According to this switch element, even in the case where the element is made to be small, at least two carbon nanotubes can compose the switch element. Further, since a bundle of uniform carbon nanotubes does not have to be formed and thus the carbon nanotubes having an arbitrary structure can be used, the switch element having excellent productivity is realized. Since this switch element can be composed of a small number of the carbon nanotubes, a driving voltage for making a contact with the electrode can be set lower, and thus a deterioration in the element property due to a rise in the driving voltage can be prevented effectively.

According to this switch element, therefore, the switch element using the carbon nanotubes where the deterioration in the property due to the miniaturization of the element is prevented by the simple structure can be provided.

The above explains the case where the switch element is composed of two single-walled carbon nanotubes, but the present invention is not limited to this. Multi-walled carbon nanotubes may be used, and a larger number of carbon nanotubes may be used. When, however, at least two carbon nanotubes are used, the switch element of the present invention can be realized.

A method of manufacturing the switch element 1 of this embodiment is explained below. In the method of manufacturing the carbon nanotube of this embodiment, a plurality of carbon nanotubes can be grown on the substrate 11 by using the CVD method. The drawings to be used in the following explanation illustrate the case where a plurality of carbon nanotubes are manufactured.

<Formation of the Conductive Layer>

Figure 5A:
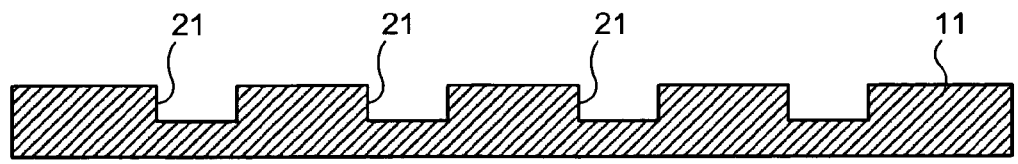
FIGS. 5A to 5C are sectional views explaining a method of manufacturing a switch element according to the first embodiment.
Figure 5B:
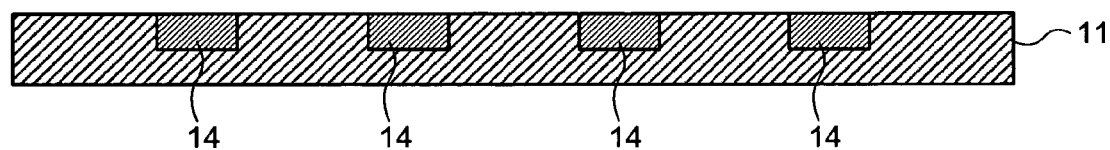

A silicon substrate is prepared as the substrate 11, and a part of the substrate 11 is removed with predetermined interval and depth by an existing etching technique, and as shown in FIG. 5A, an area (groove portion) 21 for forming the conductive layer 14 is formed. For example, aluminum (Al) is implanted as the conductive layer material in the area (groove portion) 21, and as shown in FIG. 5B, and the conductive layer 14 is formed.

<Arrangement of Catalytic Metal Particles on the Substrate>

In the formation of the switch element 1 of this embodiment, it is necessary to control positions and diameters of the carbon nanotubes 12a and 12b grown on the substrate 11. For this reason, in this embodiment, the catalytic metal particles are formed and arranged by an existing electron beam lithography technique which is used for a semiconductor manufacturing process.

Figure 5C:
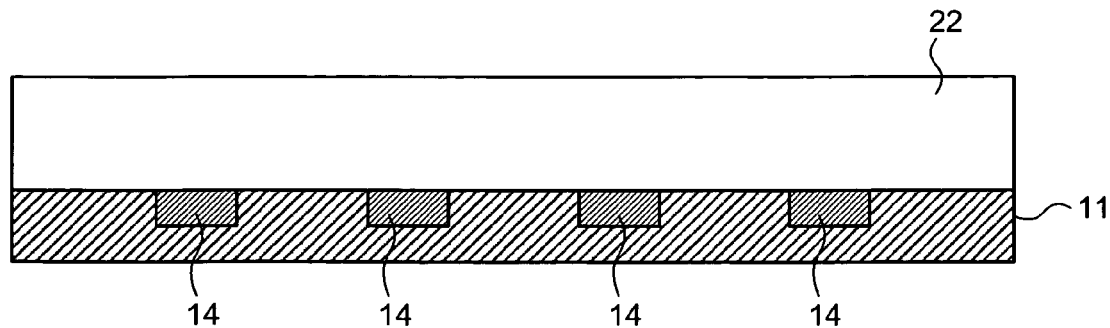
Figure 5D:
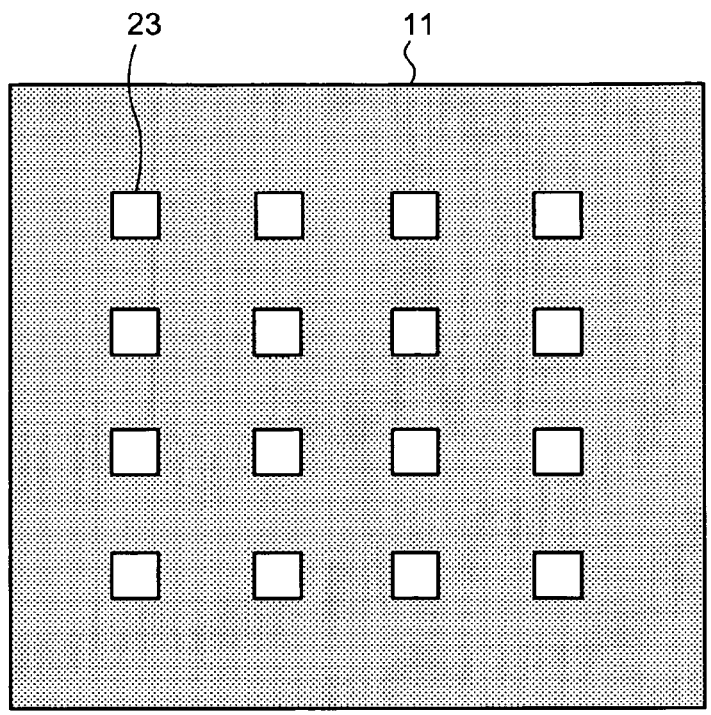
FIGS. 5D to 5F are top views explaining a method of manufacturing a switch element according to the first embodiment.

For example, cobalt fine particles are prepared as the catalytic metal material, and the cobalt fine particles are mixed with negative resist. The negative resist 22 containing the cobalt fine particles is applied onto the substrate 11 formed with the conductive layer 14 as shown in FIG. 5C. Electron-beam exposure and development are carried out, so that fine resist patterns 23 are formed as shown in FIG. 5D. The resist patterns are formed on the conductive layer 14, and the interval between the resist patterns 23 is, for example, about 30 nm. In such a manner, the interval of the resist patterns 23 is controlled so that the positions of the catalytic metal particles can be controlled. FIG. 5D is a top view when the substrate formed with the fine resist patterns is viewed from the top.

Figure 5E:
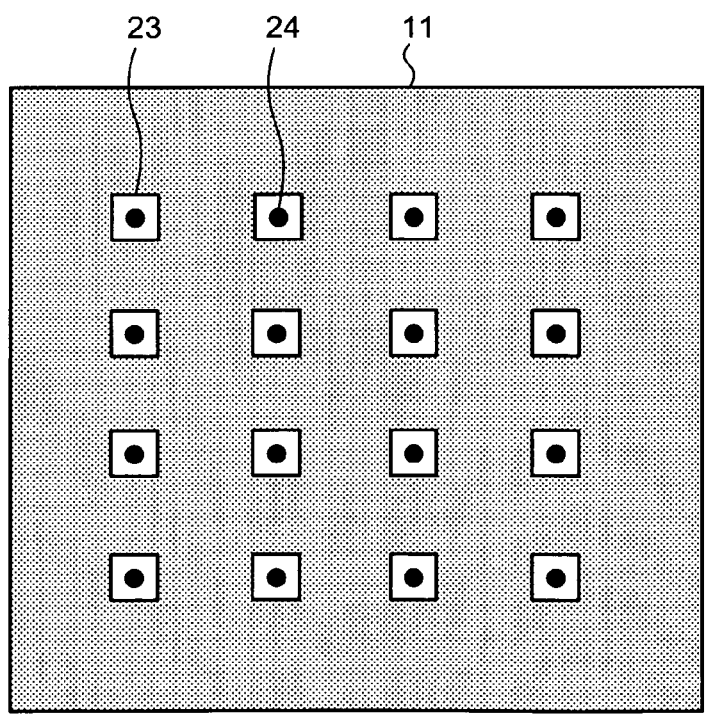
Figure 5F:
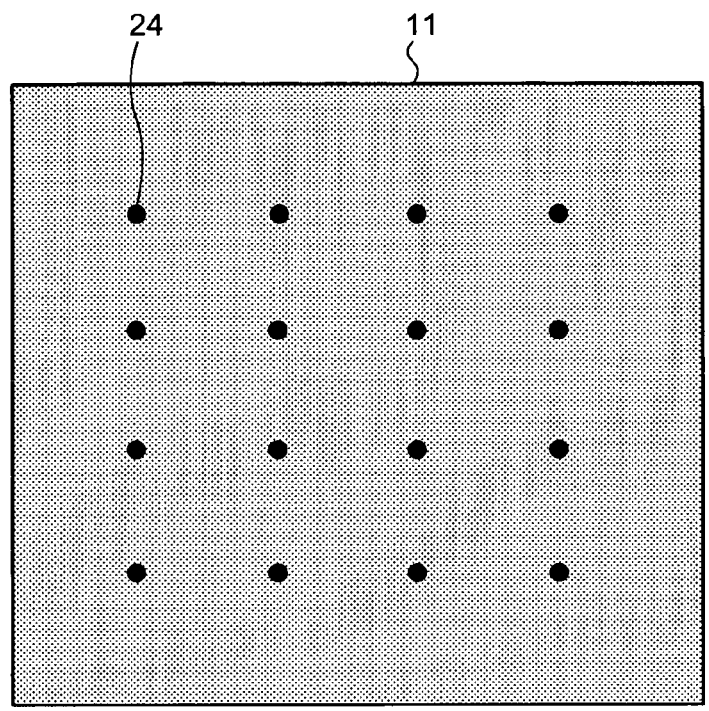

Thereafter, when heat treatment is given to the substrate 11, the cobalt fine particles are allowed to aggregate in the fine resist patterns 23 as shown in FIG. 5E, and the diameters are controlled so that the cobalt particles 24 are formed as the catalytic metal particles having predetermined diameter. Unnecessary resist is removed by the existing etching technique, so that the cobalt particles 24 with diameter of about 15 nm, for example, are arranged on the substrate 11 as shown in FIG. 5F. As a result, the substrate, which has the magnetic particles as the catalytic metal fine particles arranged with their arrangement positions and diameters being controlled on the substrate 11, is formed. Here, FIG. 5F is a top view when the substrate where the aggregated cobalt particles arranged is viewed from the top.

Growth of the Carbon Nanotube

Figure 6:
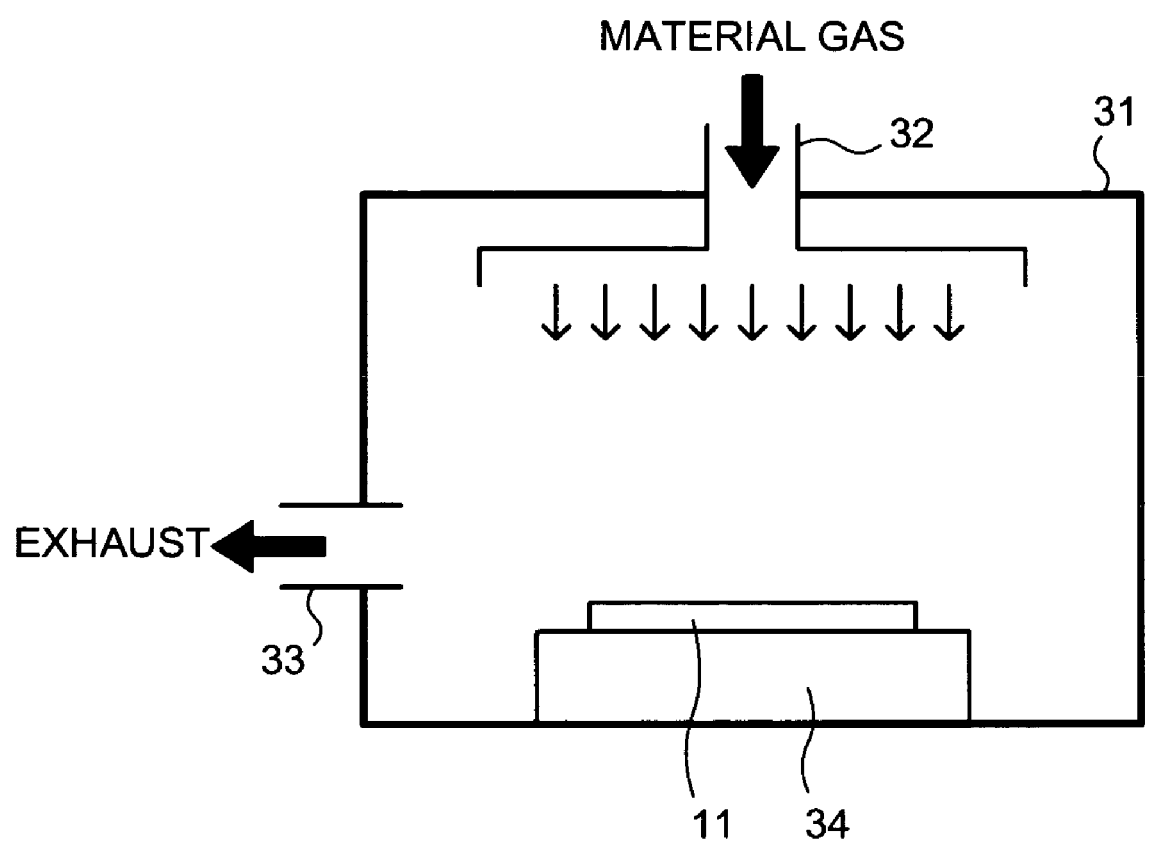
FIG. 6 is a diagram typically illustrating one example of a reacting furnace in a CVD device used for growing a carbon nanotube.

The carbon nanotube is grown by the CVD method on the substrate 11 where the cobalt particles 24 are arranged in the above manner. FIG. 6 illustrates one example of a constitution of a reactor of the CVD device to be used for growing the carbon nanotube. In order to grow the carbon nanotube using the CVD device shown in FIG. 6, the substrate 11 is disposed in the reactor 31 composed of a silica tube or the like, and while, for example, ethanol gas is being allowed to flow as a material gas through a material gas inlet 32 provided on the reactor 31 and is being exhausted from an exhaust port 33, the substrate 11 is simultaneously heated by a heater 34.

Figure 5G:
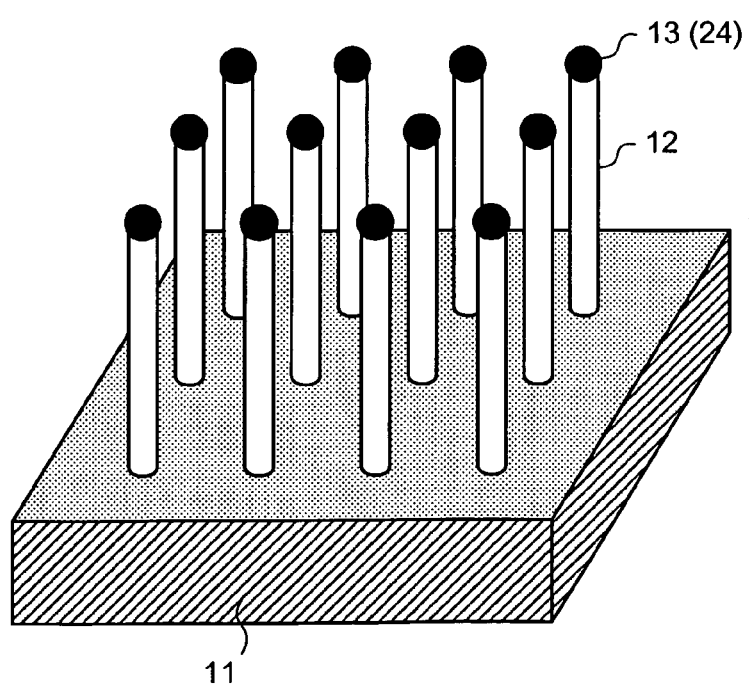
FIG. 5G is a perspective view explaining a method of manufacturing a switch element according to the first embodiment.

The growing direction of the carbon nanotube 12 at this time can be controlled by applying a predetermined voltage, for example, 200V in the growing direction. FIG. 5G is a pattern diagram illustrating the growing step of the carbon nanotube while the voltage is being applied. At this time, the substrate 11 is arranged on a cathode side. The substrate 11 is biased to negative with respect to the decomposed ethanol gas, so that the carbon nanotube 12 grows in a direction of the electric field.

In such a manner, a plurality of carbon nanotubes 12, which have approximately the same diameter as that of the cobalt particles 24 as the growth nucleus are grown approximately vertically to the surface of the substrate 11, so that the switch element 1 according to this embodiment shown in FIG. 1 can be formed.

The above explains one switch element as an example, but a plurality of switch elements can be simultaneously formed by forming a plurality of single-walled or multi-walled carbon nanotubes.

In a second embodiment, a modified example of the switch element explained in the first embodiment is explained. Also in the switch element of the second embodiment, therefore, the basic operating principle and the design principle are similar to those in the first embodiment.

In the switch element 1 according to the first embodiment, in order to repeatedly perform the contacting and separating operations, it is preferable that one magnetization of the magnetic particle 13 arranged at one end of the carbon nanotube 12 is fixed from the viewpoint of reducing malfunction probability. From this viewpoint, the conductive layer 14 formed between one end of the carbon nanotube 12 and the substrate 11 is preferably composed of a magnetic laminated film whose magnetizing direction is fixed.

Figure 7A:
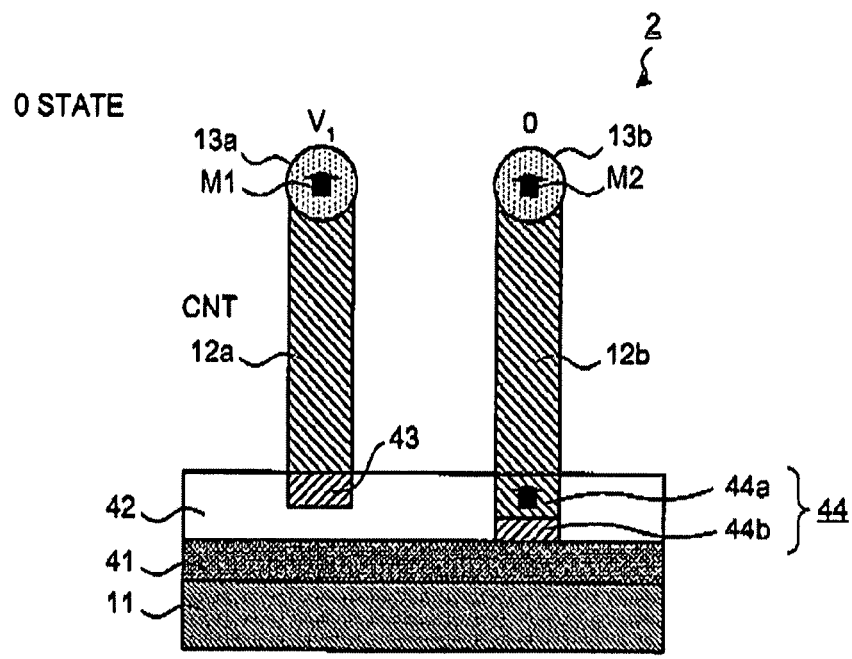
FIG. 7A is a sectional view typically illustrating a schematic constitution of a switch element according to a second embodiment.

FIG. 7A is a sectional view illustrating a schematic constitution of the switch element 2 according to a second embodiment. As shown in FIG. 7A, a switch element 2 of the second embodiment is constituted so as to include a substrate (semiconductor substrate) 11, the high-doped semiconductor conductive layer (wiring) 41 formed on a surface layer portion of the substrate 11, a pair of carbon nanotubes 12a and 12b which are provided upright on the high-doped semiconductor conductive layer (wiring) 41, magnetic particles 13a and 13b which are arranged at tip ends of the carbon nanotubes 12a and 12b, respectively, an insulating layer 42 formed on the high-doped semiconductor conductive layer (wiring) 41, a conductive layer 43 which is formed between the base end of the carbon nanotube 12a and the high-doped semiconductor conductive layer (wiring) 41 so as to be insulated from the high-doped semiconductor conductive layer (wiring) 41, and a magnetic laminated film 44 which is formed between the base end of the carbon nanotube 12b and the high-doped semiconductor conductive layer (wiring) 41.

For easy understanding, the same members as those of the switch element 1 in the first embodiment are designated by the same reference numerals, and detailed explanation thereof is omitted.

In the switch element 2 according to the second embodiment having the above constitution, an electricalpotential difference is generated between the conductive layer 43 and the magnetic laminated film 44, so that the carbon nanotubes 12a and 12b can be brought into contact with each other. An electrical current is allowed to flow between the carbon nanotubes 12a and 12b in the contact state so that they can be separated from each other. The switching operation can be performed by these operations.

Figure 7B:
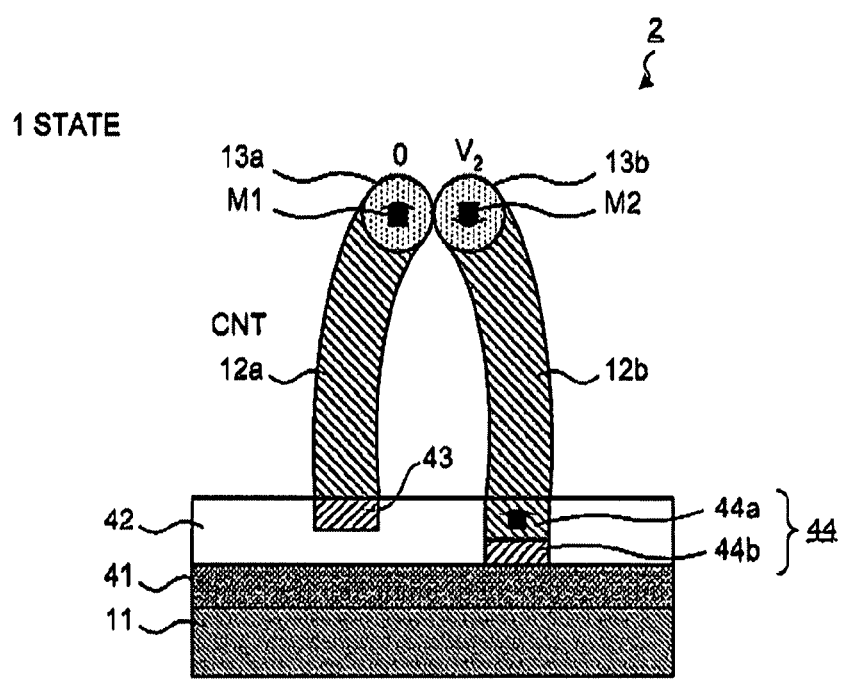
FIG. 7B is a sectional view explaining an operating state of the switch element according to the second embodiment.

That is, when a voltage is applied between the conductive layer 43 and the magnetic laminated film 44, an electrostatic attraction force is generated between the magnetic particles 13a and 13b. When the electrostatic attraction force becomes stronger than the elastic force of the carbon nanotubes 12a and 12b, the carbon nanotubes 12a and 12b can be brought into contact with each other. At this time, it is preferable that the magnetic particles 13a and 13b arranged at the tip ends of the carbon nanotubes 12a and 12b, respectively, are also brought into contact with each other at the time of the contact between the carbon nanotubes 12a and 12b. When the magnetic particles 13a and 13b are once sufficiently close to each other, as shown in FIG. 7A, the magnetizing direction M1 of the magnetic particle 13a and the magnetizing direction M2 of the magnetic particle 13b which face the same direction in the initial state become opposite to each other so as to become stable as shown in FIG. 7B.

Although electric charges which charge the carbon nanotubes 12a and 12b and the magnetic particles 13a and 13b disappear instantly upon contacting each other, when the magnetic dipolar moment interaction (attraction force) generated between the magnetic particles 13a and 13b is stronger than the elastic force of the carbon nanotubes 12a and 12b, the contact state is retained.

On the contrary, when a voltage is applied between the conductive layer 43 and the magnetic laminated film 44 in the contact state, an electrical current flows in the carbon nanotubes 12a and 12b, a spin injection occurs between the magnetic particles 13a and 13b, and the magnetizing directions M1 and M2 of the magnetic particles 13a and 13b are aligned. For this reason, the magnetic dipolar moment interaction (attraction force) between the magnetic particles 13a and 13b becomes repulsive, and the elastic force is generated between the carbon nanotubes 12a and 12b. For this reason, the two carbon nanotubes 12a and 12b are separated from each other.

This is the operating principle of the switch element using the carbon nanotubes according to the second embodiment. In the switch element 2 of the second embodiment, the magnetic laminated film 44 is used as one of the conductive layers formed between the carbon nanotube 12b and the substrate 11. An example of the magnetic laminated film 44 is a magnetic laminated film which is composed of a cobalt layer 44a as a conductive magnetization fixed layer having conductivity whose magnetizing direction is fixed and an aluminum layer 44b as a protective layer formed between the cobalt layer 44a and the high-doped semiconductor conductive layer (wiring) 41 as shown in FIG. 7A.

The aluminum layer 44b is provided so as to prevent silicifying of the cobalt layer 44a due to a temperature rise at the time of the CVD method for growing the carbon nanotube after the magnetic laminated film 44 is formed on the high-doped semiconductor conductive layer (wiring) 41 and protect the cobalt layer 44a. The aluminum layer 44b as the protective layer may be formed so as to cover the cobalt layer 44a as the conductive magnetization fixed layer.

The aluminum layer 44b also forms Schottky diode between the aluminum layer 44b and the high-doped semiconductor conductive layer (wiring) 41. The Schottky diode is important from the following viewpoint. That is, an electrical current is prevented from flowing between the carbon nanotubes 12a and 12b with respect to the voltage to be applied when the magnetic particles 13a and 13b contact with each other. This is because when the spin injection occurs due to the applied voltage, the direction of the magnetization is aligned at the moment when the magnetic particles 13a and 13b come in contact with each other, and thus the contact state between the magnetic particles 13a and 13b cannot be retained.

In order to prevent this situation, resistance between the conductive layer 43 and the magnetic laminated film 44 should be set or the diode should be inserted so that density of a current flowing between the carbon nanotubes due to the voltage to be applied for the contact becomes not more than the current density necessary for the spin injection. As a result, the switch element can be operated.

Like this switch element 2, however, when the Schottky diode is formed between the magnetic laminated film 44 and the high-doped semiconductor conductive layer (wiring) 41, a width of the voltage to be applied can be widened, and further the switch element itself can be miniaturized. As a result, this switch element 2 is very useful. When the cobalt layer 44a, for example, is formed as the magnetic layer in the magnetic laminated film 44, it can be utilized as a catalyst to be used for the CVD method, and thus this element is useful from the viewpoint of manufacturing. When the switch element is integrated as a memory element, it can be used as a selection element, and thus this element is important industrially.

In the second embodiment, according to FIGS. 7A and 7B, the state that the carbon nanotubes 12a and 12b contact with each other is defined as a "1" state, and the state that they are separated from each other is defined as a "0" state. When to bring into the "1" state is defined as "input" and the voltage for "input" is designated by "$V_1$", needless to say a relationship: $V_1 > V_{th}$ should hold. Meanwhile, to bring into the "0" state is defined as "delete", and the voltage for "delete" is designated by "$V_2$".

In the case of the switch element 2 of the second embodiment, the Schottky joint is formed between the magnetic laminated film 44 and the high-doped semiconductor conductive layer (wiring) 41. For this reason, it is necessary to apply a deleting voltage $V_2$ higher than Schottky barrier. Normally, in the case of the Schottky joint between the aluminum layer and the silicon layer with which impurity of about $10^{19}$ is doped, it is considered that the height of the Schottky barrier is about 0.4 eV. In this switch element 2, therefore, $V_2$ should be set to not less than about 0.4 V in the case of the similar condition.

In the switch element according to the second embodiment, similarly to the switch element according to the first embodiment, the high mechanical strength of the carbon nanotubes are utilized. For this reason, the switch element has high durability against the repetition of the contacting and separating operations for the carbon nanotubes, so that the switch element having excellent durability is realized.

In the switching element according to the second embodiment, similarly to the switch element according to the first embodiment, when an electrical potential difference is generated between the conductive layers, the switch on and off operations (contact and separation of the carbon nanotubes) are switched by utilizing the electrostatic attraction force generated on the carbon nanotubes and also the magnetic dipolar moment interaction generated between the magnetic particles. For this reason, the switching operation can be performed securely.

In the switch element according to the second embodiment, similarly to the switch element of the first embodiment, the electrode is arranged on the substrate, and thus the electrode does not have to be arranged three-dimensionally. For this reason, the switch element can be constituted by the simple structure. According to this switch element, even in the case where the element is made to be small, at least two carbon nanotubes can compose the switch element. Further, since a bundle of uniform carbon nanotubes does not have to be manufactured and the carbon nanotubes having arbitrary structure can be used, the switch element having excellent productivity is realized. Since this switch element can be composed of a small number of the carbon nanotubes, a driving voltage for contact with the electrode can be set to a small value, so that deterioration in the element property due to a rise in the driving voltage can be prevented effectively.

This switch element includes the magnetic laminated film having the conductive magnetization fixed layer which provides conductivity and magnetizing direction thereof is fixed as the conductive layer formed between one end of the carbon nanotube 12 and the substrate 11. As a result, malfunction probability at the time when the contact and separation of the carbon nanotubes are repeatedly carried out can be reduced.

In the switch element, the Schottky diode is formed between the magnetic laminated film and the high-doped semiconductor conductive layer (wiring). For this reason, the width of the voltage to be applied can be widened, and further the switch element itself can be miniaturized. When the switch element is integrated as the memory element, it can be utilized as a selection element, and thus an exclusive selection element is not necessary, thereby realizing simplification and miniaturization of the structure of the memory element.

According to the switch element, therefore, the switch element using the carbon nanotubes, in which the deterioration in the property due to the miniaturization of the element can be prevented by the simple structure, can be provided.

A method of manufacturing the switch element 2 of the second embodiment is explained below.

Manufacturing of the Substrate

Figure 8A:
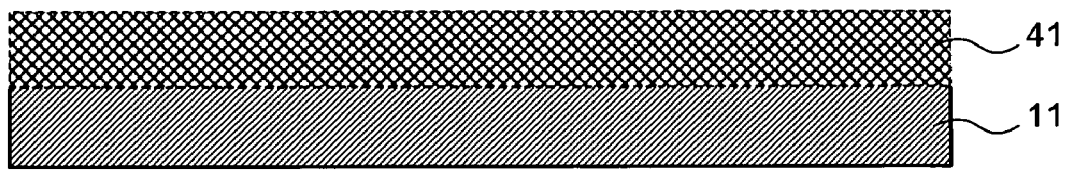
FIGS. 8A to 8H are sectional views explaining a method of manufacturing a switch element according to the second embodiment.
Figure 8B:
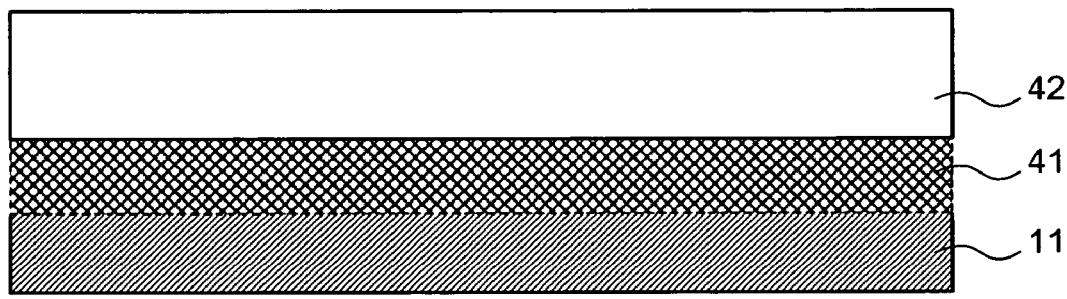

As shown in FIG. 8A, for example, a silicon substrate is prepared as the substrate 11, about $5 \times 10^{19}$ cm$^{-3}$ of impurity is introduced into the silicon substrate by implantation, so that the high-doped semiconductor conductive layer (wiring) 41 is formed. As implant ion species at this time, for example, As (arsenic) is used. As shown in FIG. 8B, a silicon oxide film, for example, is formed as the insulating layer 42 on the high-doped semiconductor conductive layer (wiring) 41.

Figure 8C:
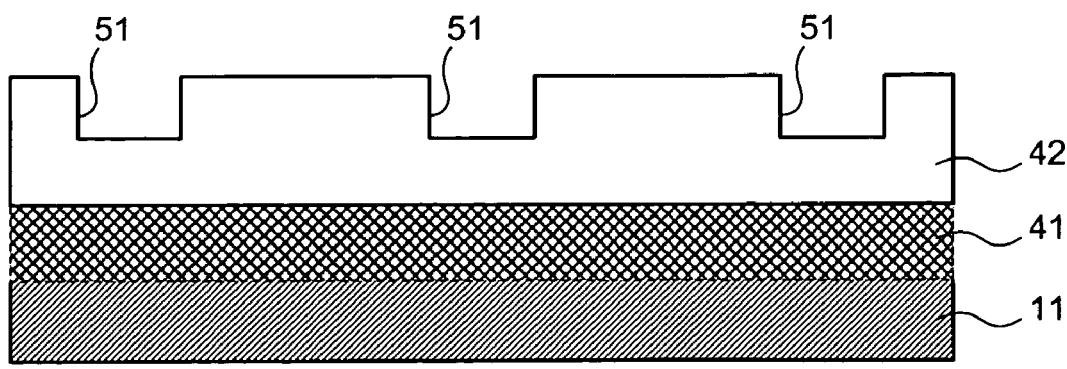
Figure 8D:
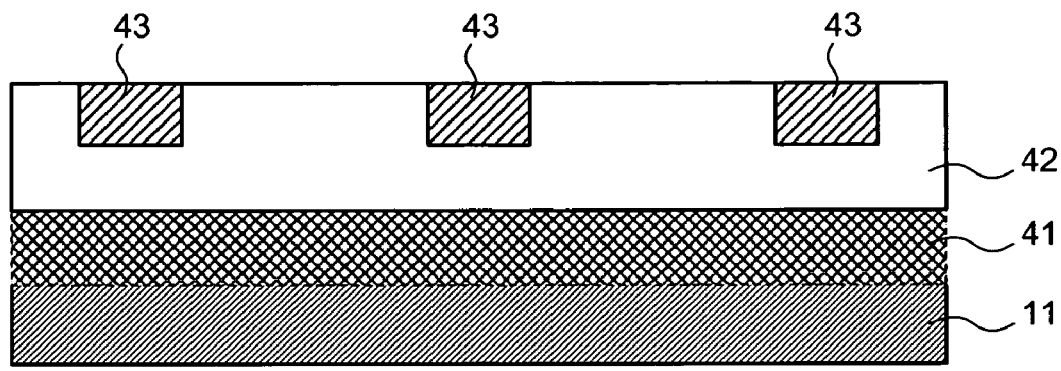

Next, the insulating layer 42 is removed by the existing etching technique with predetermined interval and depth, and as shown in FIG. 8C, an area (groove portion) 51 for forming the conductive layer 43 is formed. Aluminum (Al), for example, is implanted as the conductive layer material into the area (groove portion) 51, and as shown in FIG. 8D, the conductive layer 43 is formed. Similarly to the case of the first embodiment, cobalt fine particles, for example, are mixed as the catalytic metal with a negative resist, and the negative resist containing the cobalt fine particles are applied onto the insulating layer 42 and the conductive layer 43.

Figure 8E:
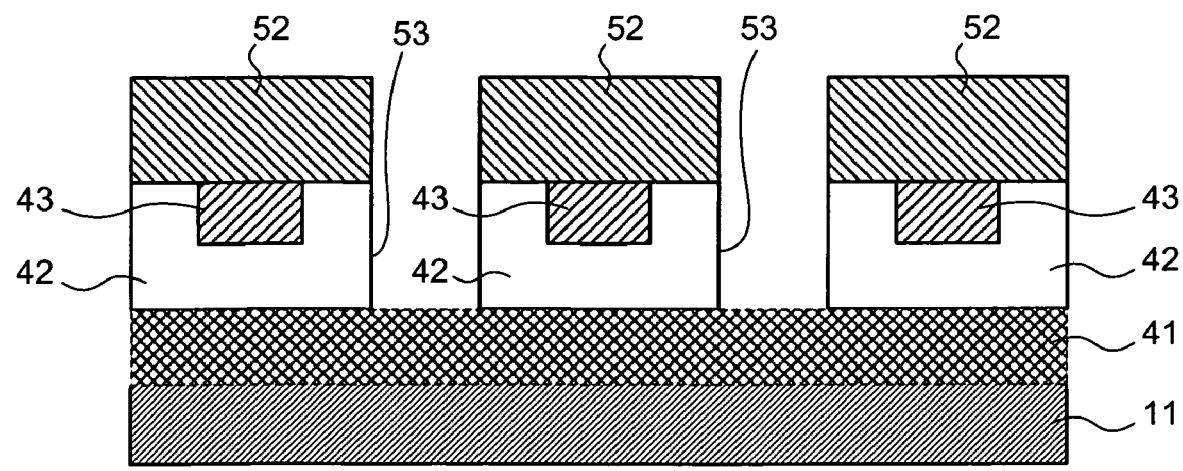

Thereafter, the resist is patterned by the existing photoengraving technique and etching technique, the insulating layer 42 in the predetermined area between the conductive layers 43 is removed by using the patterned resist patterns 52 as a mask. As a result, areas (groove portions) 53 for forming the magnetic laminated film 44 are formed as shown in FIG. 8E.

Figure 8F:
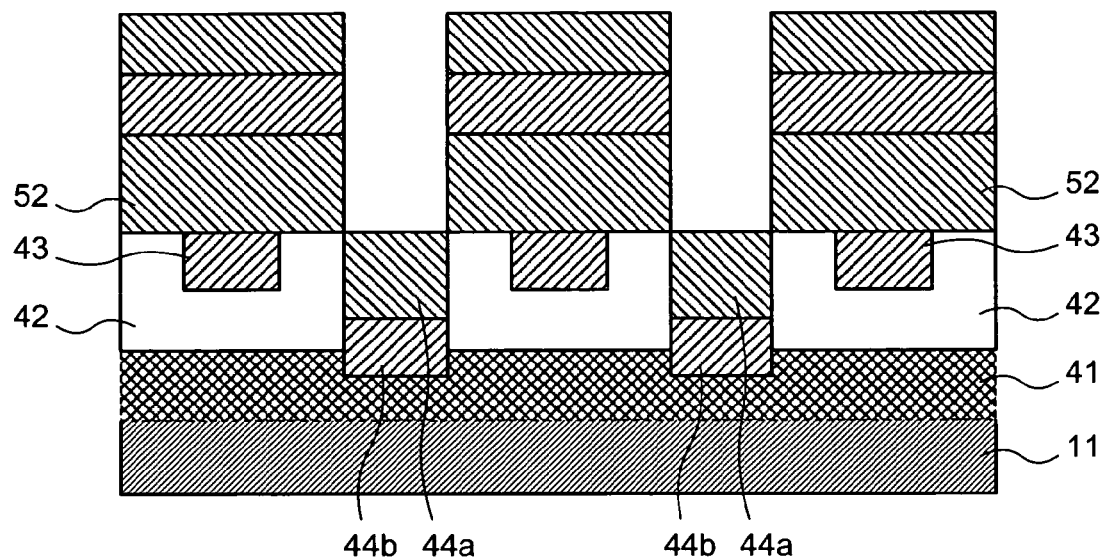

Further, aluminum and cobalt are deposited in this order by the existing technique, so that the magnetic laminated films 44 are formed on the areas (groove portions) 53 as shown in FIG. 8F. The magnetic laminated film 44 is constituted so that the aluminum layer 44b as the protective layer and the cobalt layer 44a as the conductive magnetization fixed layer are laminated.

Figure 8G:
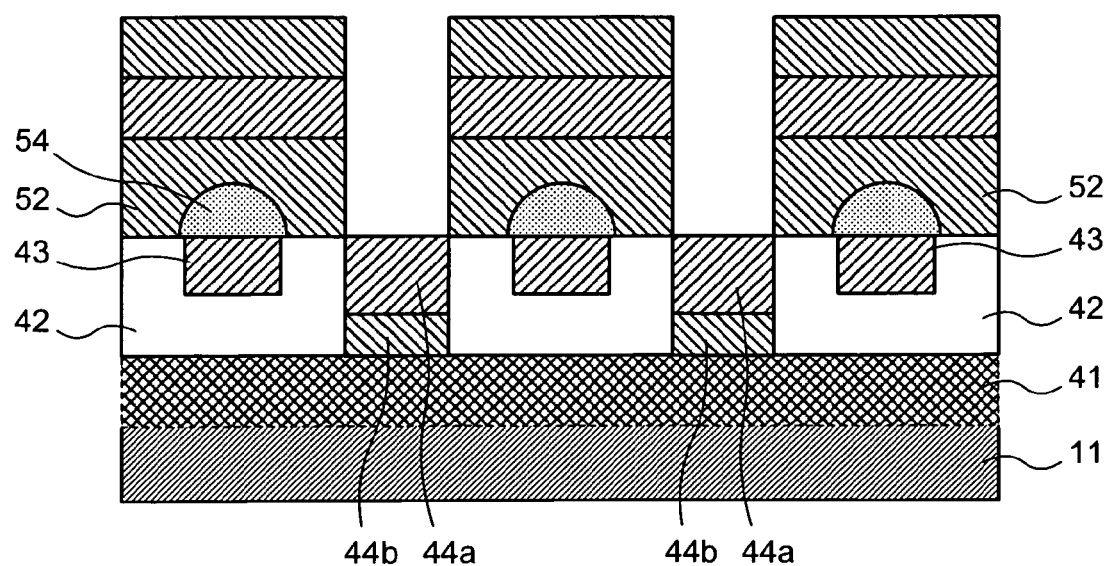
Figure 8H:
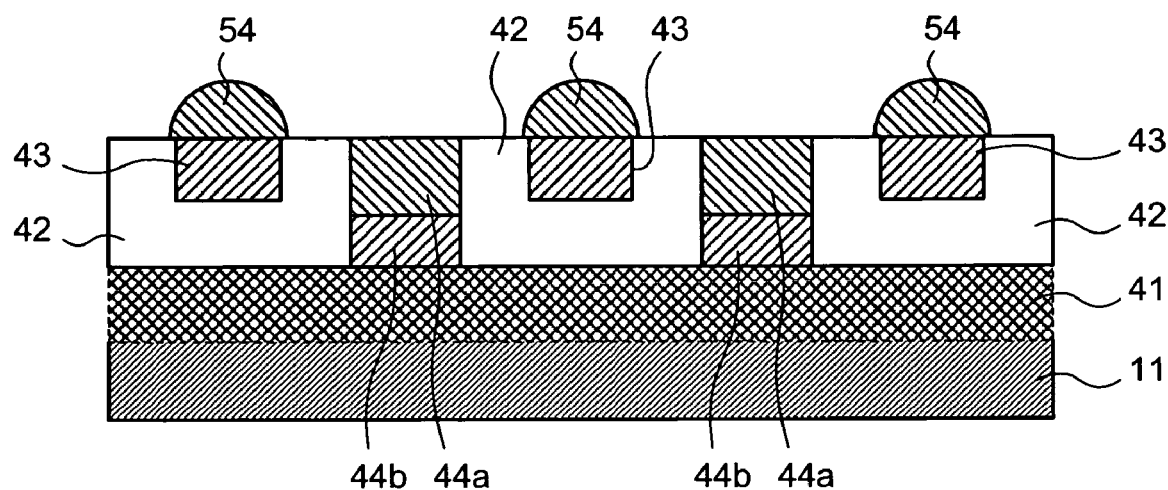

Thereafter, heat treatment is given so that the cobalt fine particles are allowed to aggregate in the fine resist patterns 52 as shown in FIG. 8G, and the diameters are controlled so that the cobalt particles 54 are formed as the catalytic metal particles having predetermined diameter. Unnecessary cobalt layer, aluminum layer and resist pattern 52 are removed by the existing etching technique, so that the cobalt particles 54 with diameter of about 15 nm, for example, are arranged on the substrate 11 as shown in FIG. 8H. As a result, the substrate, which has the magnetic particles as the catalytic metal fine particles arranged with arrangement positions and diameters being controlled on the substrate 11, is formed.

<Growth of the Carbon Nanotube>

Similarly to the case of the first embodiment, the carbon nanotube is grown by the CVD device as shown in FIG. 6 according to the CVD method. That is, the substrate 11 is disposed in the reactor 31 composed of a silica tube or the like, and while, for example, ethanol gas is being allowed to flow as a material gas through the material gas inlet 32 provided on the reactor 31 and is being exhausted from the exhaust port 33, the substrate 11 is heated by the heater 34.

The growing direction of the carbon nanotube 12 at this time can be controlled by applying a predetermined voltage, for example, 200V in the growing direction. At this time, the substrate 11 is arranged on the cathode side. The substrate 11 is biased to negative with respect to the decomposed ethanol gas, so that the carbon nanotube grows in a direction of the electric field.

In such a manner, a plurality of carbon nanotubes 12, which have approximately the same diameter as that of the cobalt particles 54 as the growth nucleus are grown approximately vertically to the surface the substrate 11, so that the switch element 2 according to the second embodiment shown in FIG. 7A can be formed.

A third embodiment explains the memory element. The memory element according to the third embodiment is constituted so that a plurality of the switch elements 2 in the second embodiment are arranged. Also in the switch element of the third embodiment, therefore, the basic operating principle and design principle are similar to the case of the first embodiment.

Figure 9:
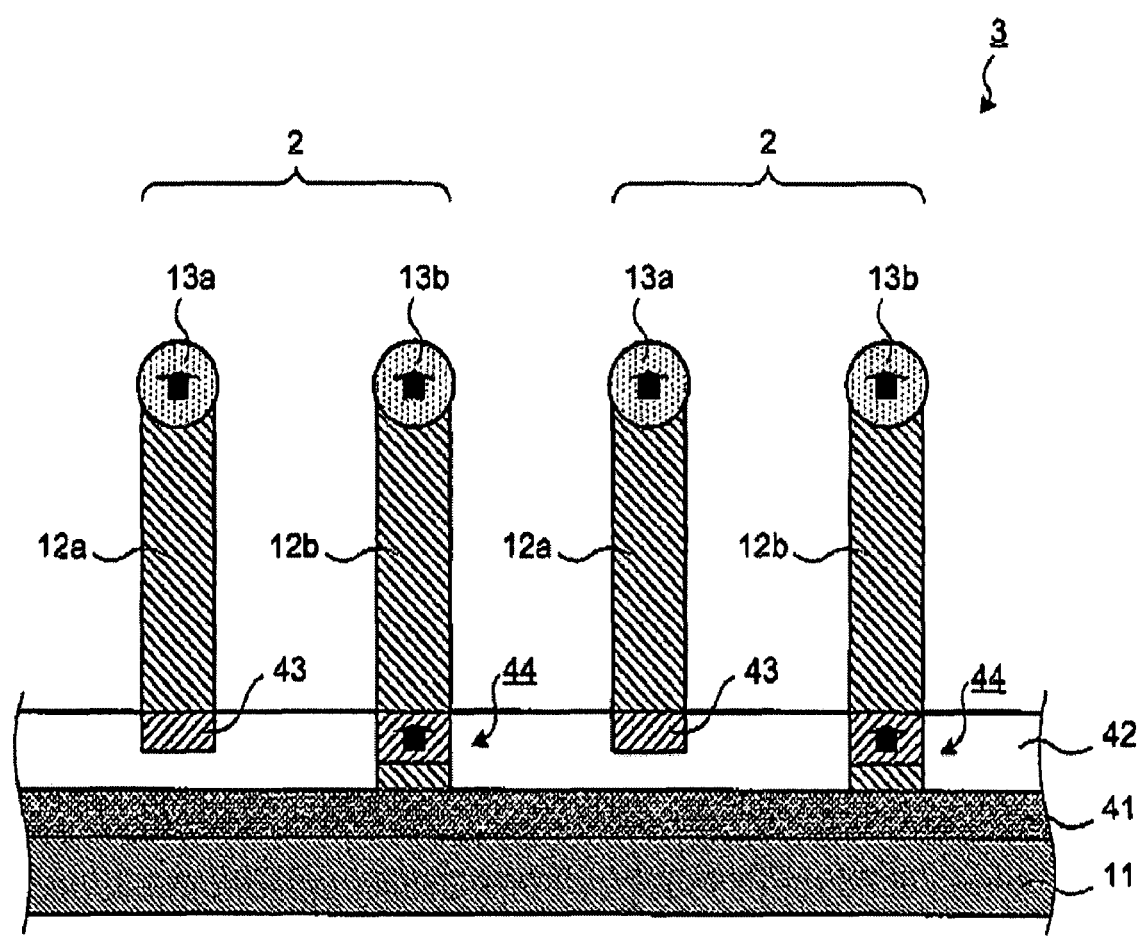
FIG. 9 is a sectional view typically illustrating a schematic constitution of the memory element according to a third embodiment.
Figure 10:
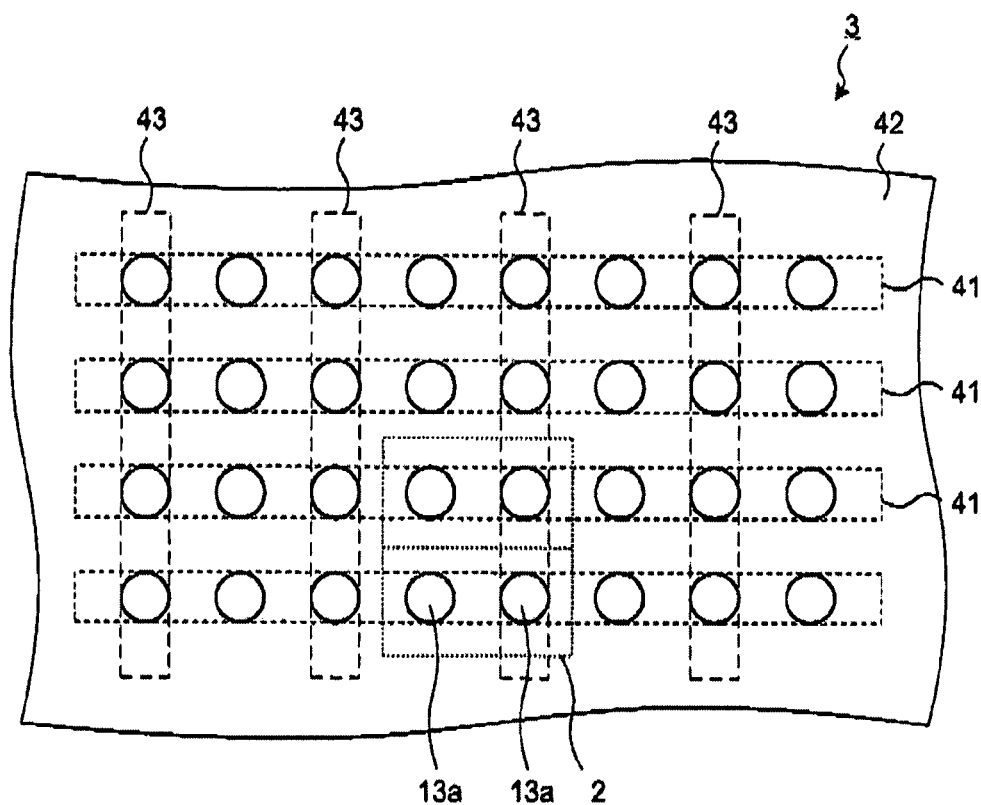
FIG. 10 is a top view when the memory element according to the third embodiment is viewed from the top.

FIGS. 9 and 10 are diagrams illustrating the memory element according to the third embodiment. FIG. 9 is a sectional view illustrating the constitution of the memory element according to the third embodiment, and FIG. 10 is a top view when the substrate of the memory element is viewed from the top. For easy understanding, the same members as those in the switch elements 1 and 2 according to the first and second embodiments are designated by the same reference numerals, and the explanation thereof is omitted.

In the memory element according to the third embodiment, since a plurality of the switch elements 2 of the second embodiment are arranged, the memory element which has the effect of the switch element 2 in the second embodiment is realized. The memory element using the carbon nanotubes, in which the deterioration in the property due to the miniaturization of the element is prevented by the simple structure, is realized.

A fourth embodiment explains a magnetoresistive effect element which is constituted by applying the switch element 1 according to the first embodiment. Also in the magnetoresistive effect element according to the fourth embodiment, therefore, the basic operating principle and design principle are similar to the case of the first embodiment.

Figure 11:
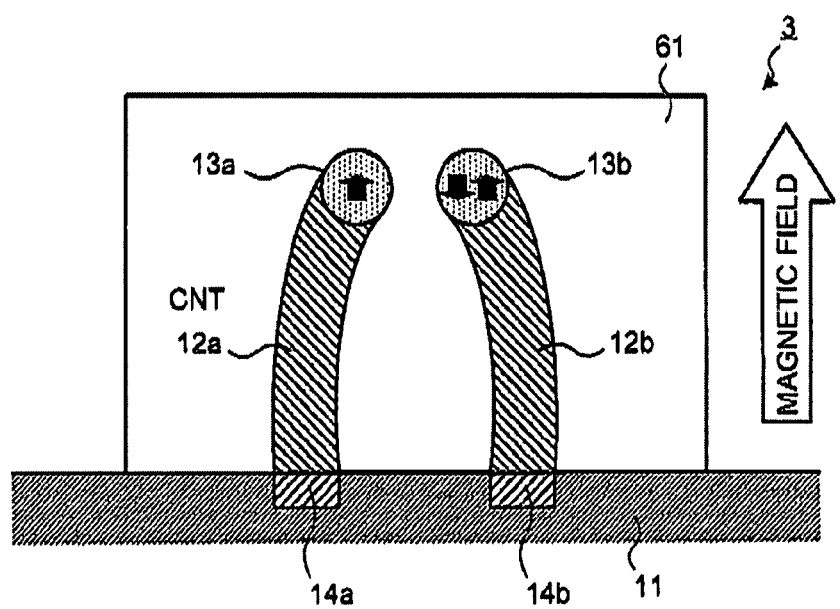
FIG. 11 is a sectional view typically illustrating a schematic constitution of a magnetoresistive effect element according to the fourth embodiment.

FIG. 11 is a sectional view illustrating the constitution of the magnetoresistive effect element 3 according to the fourth embodiment. As shown in FIG. 11, the magnetoresistive effect element 3 according to the fourth embodiment which detects an external magnetic field is constituted so as to include a substrate 11, a pair of carbon nanotubes 12*a* and 12*b* which are provided upright on the substrate 11, magnetic particles 13*a* and 13*b* arranged at the tip ends of the carbon nanotubes 12*a* and 12*b*, respectively, a pair of conductive layers 14*a* and 14*b* formed between the base ends of the carbon nanotubes 12*a* and 12*b* and the substrate 11, respectively, and a insulating layer 61 which fills in a space between the carbon nanotubes 12*a* and 12*b* and is fixed in the state that the magnetic particles 13*a* and 13*b* contact.

For easy understanding, the same members as those of the switch element 1 according to the first embodiment are designated by the same reference numerals, and the explanation thereof is omitted. In the magnetoresistive effect element according to the fourth embodiment, the very thin insulating layer 61 fills in a space between the magnetic particles 13*a* and 13*b*, but in order to clarify the presence of the insulating layer 61 between the magnetic particles 13*a* and 13*b* in FIG. 11, the space between the magnetic particles 13*a* and 13*b* are illustrated comparatively widely.

The magnetoresistive effect element 3 according to the fourth embodiment having the above constitution is characterized in sensing the external magnetic field by flowing an electrical current between the conductive layers 14*a* and 14*b*. This magnetoresistive effect element 3 senses the external magnetic field based on such a principle that a tunnel current flowing between the magnetic particles 13*a* and 13*b* via the insulating layer 61 which fills in the space between the carbon nanotubes 12*a* and 12*b* changes with respect to the external magnetic field (magnetoresistive change occurs). That is, when the external magnetic field near the magnetoresistive effect element 3 changes, the tunnel current flowing between the magnetic particles 13*a* and 13*b* changes. For this reason, a change in the magnetic field can be detected by detecting a change in the tunnel current. As a result, according to the magnetoresistive effect element, fine and very high magnetoresistive ratio can be obtained.

In the magnetoresistive effect element according to the fourth embodiment, since a plurality of the switch elements 2 in the first embodiment are arranged, the magnetoresistive effect element which has the effect of the switch element 1 in the first embodiment is realized. As a result, the magnetoresistive effect element using carbon nanotubes, in which the deterioration in the property due to the miniaturization of the element is prevented by the simple structure and fine and very high magnetoresistive ratio can be obtained, is realized.

The magnetoresistive effect element 3 according to the fourth embodiment can be formed in such a manner that the carbon nanotubes 12*a* and 12*b* and the magnetic particles 13*a* and 13*b* are fixed by the insulator material in the state that the carbon nanotubes 12*a* and 12*b* are attracted to each other with a predetermined interval in the switch element of the first embodiment.

The above explains the case where the element is composed of the two carbon nanotubes, but a bundle of plural carbon nanotubes may be used.

The present invention is explained in detailed below as specific examples. In the following drawings, the same reference numerals are used as those in the first to fourth embodiments for easy understanding.

MANUFACTURING OF THE SWITCH ELEMENT IN A FIRST EXAMPLE

In the first example, a switch element corresponding to the switch element of the first embodiment was formed according to the above-explained method. First, a high-doped semiconductor conductive layer (wiring) 41 into which about $5 \times 10^{19}$ cm$^{-3}$ of impurity was introduced by implantation was prepared onto the substrate (silicon substrate) 11. The high-doped semiconductor conductive layer 41 have thickness of 30 nm, width of 15 nm in an xdirection and interval of 15 nm. As implant species at this time, As (arsenic) was used. A silicon oxide film with thickness of 20 nm was formed thereon as the insulating layer 42.

Figure 12:
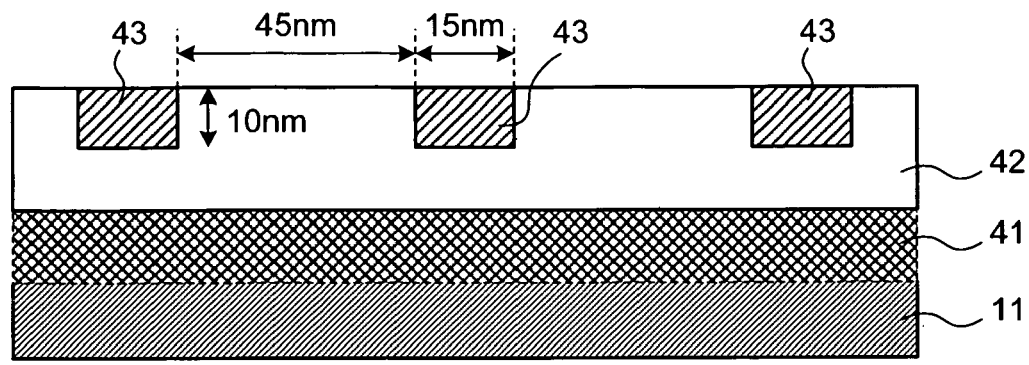
FIGS. 12 to 14 are sectional views explaining a method of manufacturing a switch element according to a first example.
Figure 12:
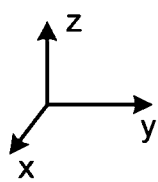
Figure 13:
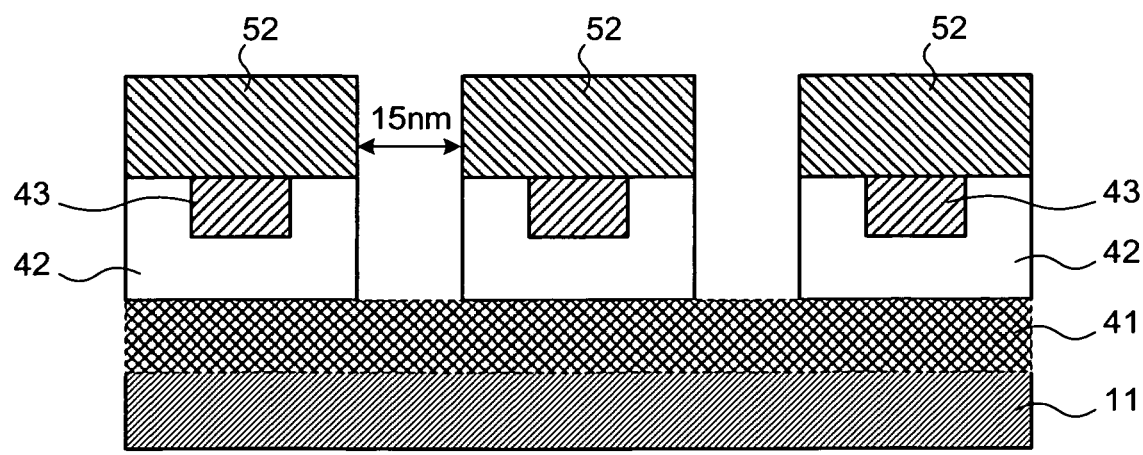
Figure 13:
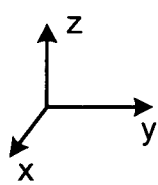

Next, removal was performed to depth of 10 nm with interval of 45 nm by the existing etching technique, so that grooves for the conductive layers were formed. As shown in FIG. 12, the aluminum layer was formed on the groove portions by the sputtering method, so that the conductive layers 43 were formed. Cobalt fine particles were prepared as the catalytic metal material, and they were mixed with a negative resist. The negative resist containing the cobalt fine particles was applied onto the substrate 11 formed with the conductive layers 43, and the electron beam exposure and development were carried out so that fine resist patterns 52 were formed as shown in FIG. 13. Thereafter, the unnecessary insulating layers 42 (silicon oxide films) were removed by the existing etching technique as shown in FIG. 13.

Figure 14:
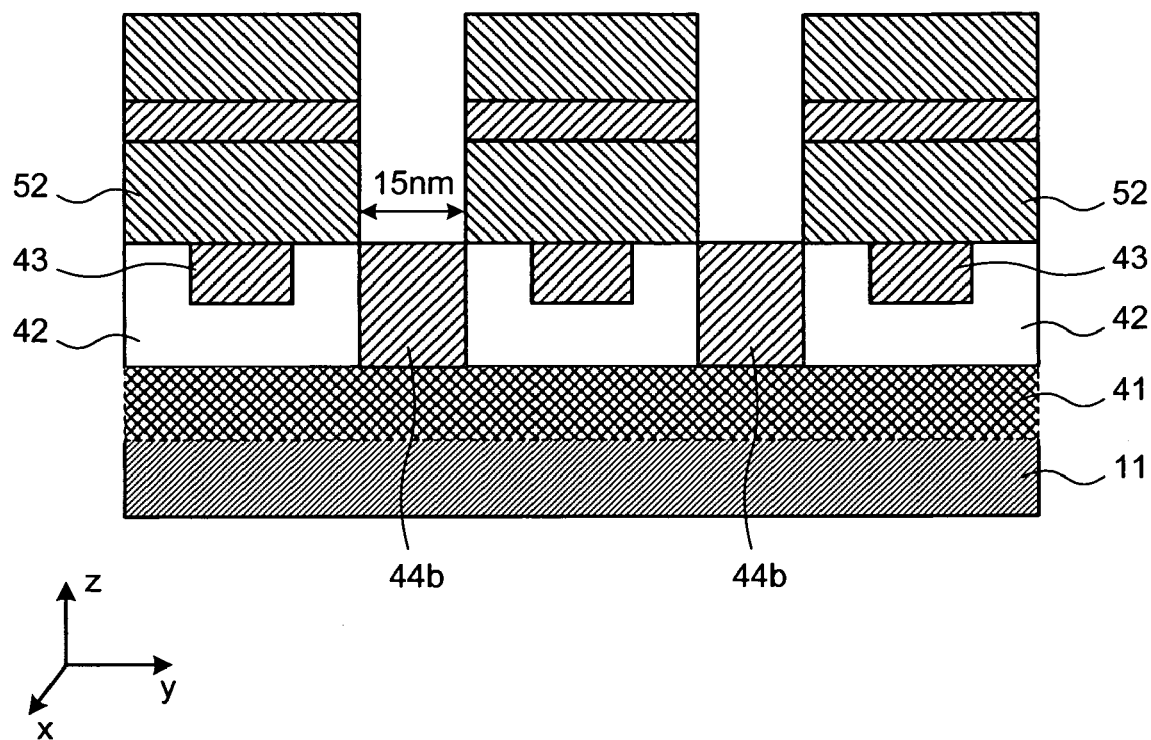

Further, the aluminum layer with thickness of 20 nm was formed by the sputtering method on the area from which the insulating layers 42 (silicon oxide films) were removed as shown in FIG. 14. In such a manner, the aluminum layers 44*b* were formed. Thereafter, the cobalt fine particles were allowed to aggregate in the fine resist patterns 52 by the heat treatment, and the resist patterns 52 were removed by the existing etching technique. As a result, the cobalt particles with diameter of about 15 nm were arranged on the substrate 11.

Next, the carbon nanotubes were grown on the substrate 11 by using the CVD device shown in FIG. 6. That is, the substrate 11 was disposed into the reactor 31 composed of the silica tube or the like, and while ethanol gas was being allowed to flow as the material gas through the material gas inlet 32 provided on the reactor and was being exhausted from the exhaust port 33, the substrate 11 was heated by the heater 34.

Here, the heating temperature of the substrate 11 was 500° C., and vapor phase epitaxy was performed for one minute. The growing direction of the carbon nanotubes at this time was controlled by applying a voltage to the growing direction. At this time, when the substrate 11 was arranged on the cathode side, the substrate 11 was biased to negative with respect to the decomposed ethanol gas, so that the carbon nanotubes were grown in the direction of the electric field.

In such a manner, a plurality of carbon nanotubes 12 having the approximately equivalent diameter to that of the cobalt particles as the growth nucleus were grown vertically to the surface of the substrate 11. As a result, the switch element of the first example having the carbon nanotubes 12a and 12b shown in FIG. 15 was formed.

The manufactured switch element was confirmed according to TEM observation as to the length of the grown carbon nanotubes 12 was about 100 nm uniformly, and the cobalt particles were arranged at the tip end of the carbon nanotubes, respectively.

Meanwhile, a difference between the switch element of the first example and the switch element of a second example is whether a cobalt layer whose magnetizing direction is fixed is formed on the lower portion of one carbon nanotube 12b or not.

Figure 16:
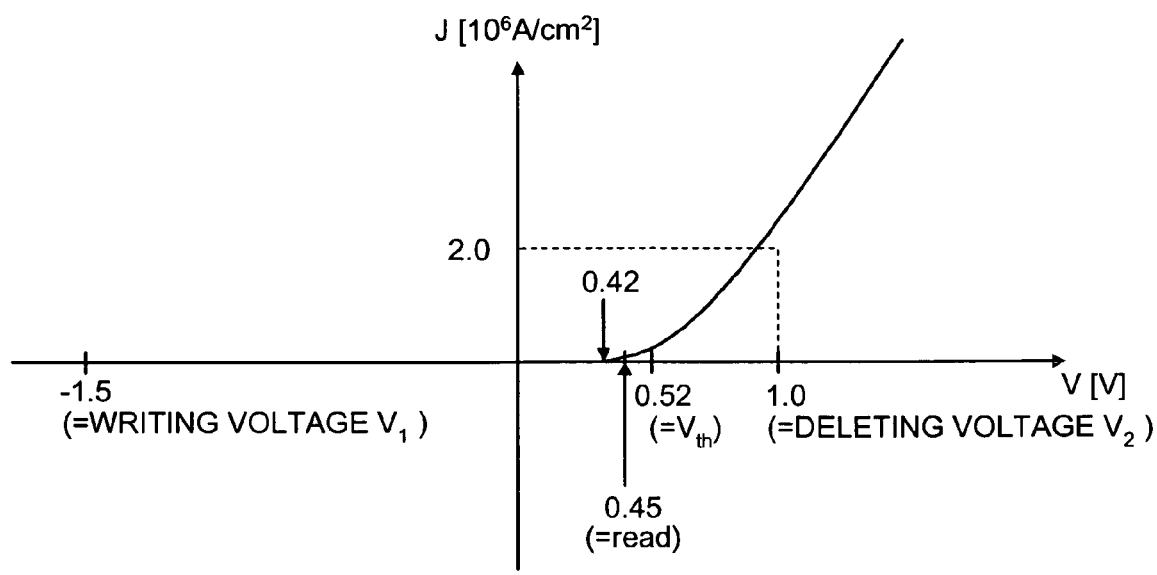
FIG. 16 is a characteristic diagram illustrating a result of measuring current-voltage characteristics (current-voltage) of a Schottky joint formed on the substrate of the switch element according to the first example.

In order to confirm whether the satisfactory Schottky joint is formed between the high-doped semiconductor conductive layer (wiring) 41 and the aluminum layer 44b before the carbon nanotubes are grown, an electrode was provided on the high-doped semiconductor conductive layer (wiring) 41 and the aluminum layer 44b, so that current-voltage characteristics were measured. The measured result was shown in FIG. 16. Since the high-doped semiconductor conductive layer (wiring) 41 is highly doped to $5 \times 10^{19}$ cm$^{-3}$, it is found that the Schottky joint ohmic. That is, it is found that the current density drastically rises from a low voltage of about 0.42 V and reaches $2.0 \times 10^6$ A/cm$^2$ near 1V.

CONFIRMATION FOR THE OPERATION OF THE SWITCH ELEMENT IN THE FIRST EXAMPLE

In this example, the carbon nanotube having length of about 100 nm was manufactured by using cobalt particles with outer diameter of about 15 nm. This manufacturing condition is, therefore, within a range of "a1 to a2" which is the condition of the outer diameter for enabling the carbon nanotubes in the contact state to be retained by the magnetic dipolar moment interaction as shown in FIG. 4. The input voltage $V_1$ is, therefore set to 1.5 V, and the deletion voltage $V_2$ is set to 1 V.

The state of the switch element is read according to whether the electrical current flows when the voltage of 0.45 V (=$V_3$) is applied to the switch element. In the result of measuring the voltage-current-characteristics of the Schottky joint, since the current density at 0.45 V is not more than $10^5$ A/cm$^2$, it is considered that the spin injection does not occur when this voltage is applied. Further, since the voltage is lower than $V_{th}$, when this voltage is applied, the carbon nanotubes do not contact and the state of the switch element is not broken.

Figure 15:
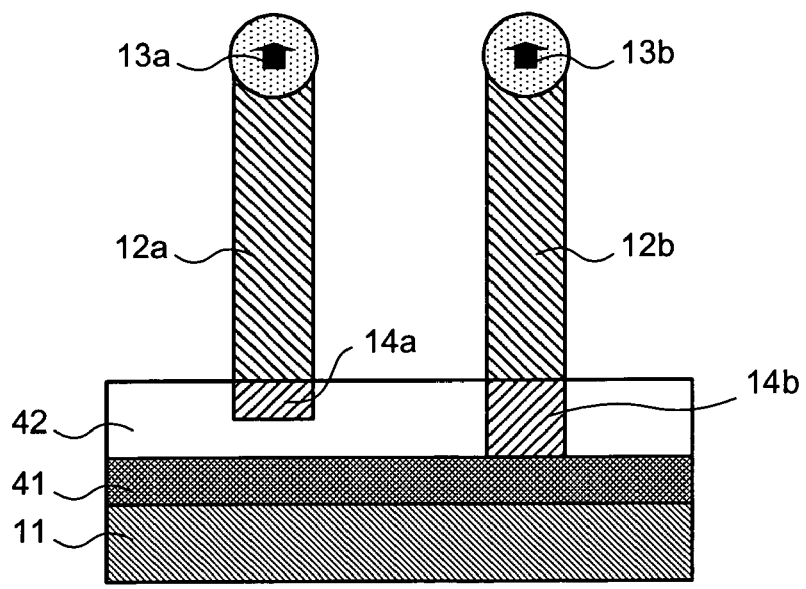
FIG. 15 is a sectional view typically illustrating a schematic constitution of a switch element according to the first example.

A magnetic field was applied to the entire produced switch element, and as shown in FIG. 15, the magnetization of the cobalt particles at the tip ends of the carbon nanotubes was aligned. In addition, the voltage was applied in such a manner that the conductive layer 43 (aluminum layer) was used as the wiring in the carbon nanotube 12a (aluminum layer) on the left side and the high-doped semiconductor conductive layer (wiring) 41 was used as the wiring in the carbon nanotube 12b (aluminum layer) on the right side shown in FIG. 15.

At first, the deletion voltage $V_2$ was applied, and after the switch was opened, input was performed. When reading was carried out after the input was performed, the current of 0.2 µA was observed, and it could be confirmed that the switch element was in the closed state. When the input voltage was reduced and the similar experiment was conducted, it was found that the switch was kept to be opened at the voltage of not more than 0.52 V. That is, $V_{th}$=0.52 V, it was confirmed that the setting of $V_1$ and $V_2$ had no problem.

Next, when reading was performed after deletion was performed, it could be confirmed that the electrical current did not flow and the switch element was in the open state. As a result, propriety of the switch element according to the first example could be confirmed. When, however, input and deletion were repeated 10000 or more times, although the voltage was input, the switch element was occasionally opened. This is because since both the magnetizing directions of the magnetic particles (cobalt particles) 13a and 13b arranged at the tip ends of the carbon nanotubes 12a and 12b are not fixed, while the deletion by means of the spin injection is being repeated, the magnetizing directions are perpendicular to each other, and thus the retaining force becomes weak due to the magnetic dipolar moment interaction.

MANUFACTURING OF THE SWITCH ELEMENT IN A SECOND EXAMPLE

Figure 17:
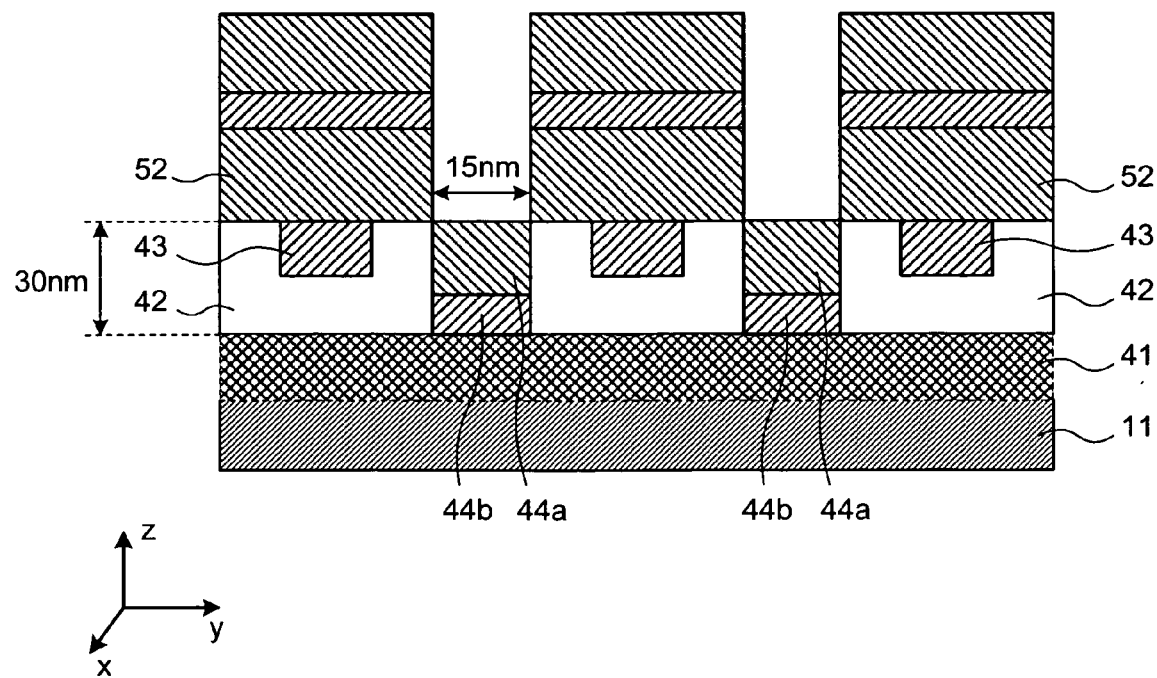
FIG. 17 is a sectional view explaining a method of manufacturing a switch element according to the second example.
Figure 18:
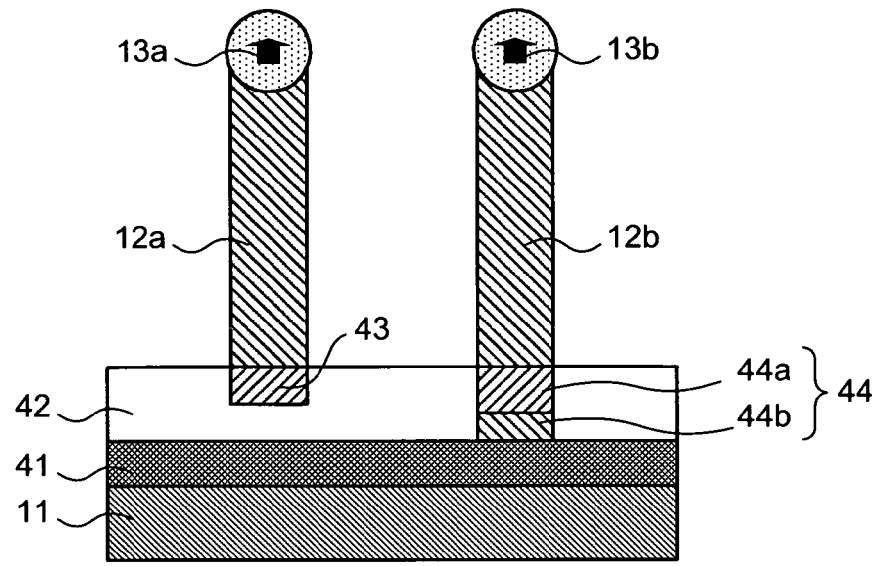
FIG. 18 is a sectional view typically illustrating a schematic constitution of a switch element according to the second example.

In the second example, the switch element corresponding to the switch element in the second embodiment was formed similarly to the first example. In the manufacturing of the switch element of the second example, as shown in FIG. 17, a silicon oxide film with thickness of 20 nm (in the first example, 20 nm) was formed as the insulating layer 42 on the high-doped semiconductor conductive layer (wiring) 41. An aluminum layer 44b with thickness of 10 nm as the protective layer and a cobalt layer 44a with thickness of 20 nm as the conductive magnetization fixed layer whose magnetizing direction is fixed were formed by the sputtering method in the area from which the insulating layer 42 (silicon oxide film) is removed. As a result, the switch element according to the second example having the carbon nanotubes 12a and 12b shown in FIG. 18 was formed.

Meanwhile, a difference between the switch element of the second example and the switch element of the first example is whether the cobalt layer whose magnetizing direction is fixed is formed on the lower portion of one carbon nanotube 12b or not.

Similarly to the first example, in order to confirm whether satisfactory Schottky joint is formed between the high-doped semiconductor conductive layer (wiring) 41 and the cobalt layer 44b before the carbon nanotubes are grown, the voltage-current characteristics were measured at electrodes provided on the high-doped semiconductor conductive layer (wiring) 41 and the cobalt layer 44b. The result similar to the first example was obtained.

CONFIRMATION FOR THE OPERATION OF THE SWITCH ELEMENT IN THE SECOND EXAMPLE

Meanwhile, the similar experiment to the first example was conducted on the manufactured switch element of the second example. The electrical current which flows after input was approximately equivalent to that of the switch element in the first example, and normality of the switching operation could be sufficiently confirmed. Even when input and deletion were repeated at 10000 or more times, it was conformed that malfunction does not occur. This is because since the spin injection is performed through the cobalt layer 44b whose magnetizing direction is fixed when deletion is performed, the magnetizing directions of the cobalt particles can be aligned at the time of deletion, and even when next input is performed, the magnetization is reversed in the same plane. For this reason, it is concluded that a reduction in the retaining force due to the magnetic dipolar moment interaction does not occur. As a result, the effectiveness of the switch element in the second example could be confirmed.

Further, according to this experiment, it is concluded that when pinning of the magnetizing direction of the magnetic particles (catalytic particles) is strengthened, malfunction probability is reduced. In order to improve the switch element of the first example, the experiment was conducted by using iron particles whose retaining force is strong as the magnetic particles (catalytic particles) instead of the cobalt particles. As a result, it was conformed that even when input and deletion were repeated 10000 or more times, malfunction did not occur.

MANUFACTURING OF THE SWITCH ELEMENT IN A THIRD EXAMPLE

In the third example, a plurality of the switch elements of the second example were arranged as the memory element corresponding to the memory element in the third example as shown in FIGS. 9 and 10, so that the memory element was constituted.

CONFIRMATION FOR THE OPERATION OF THE MEMORY ELEMENT IN THE THIRD EMBODIMENT

Figure 19:
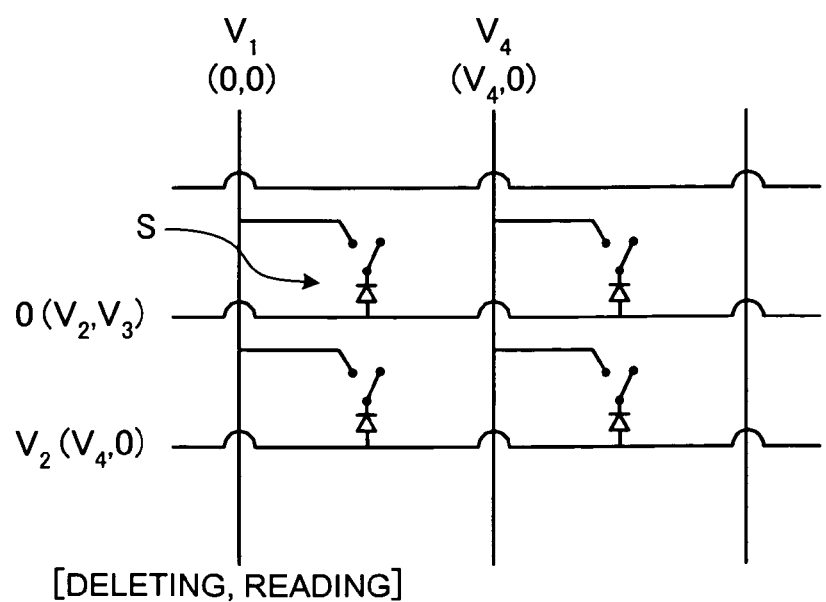
FIG. 19 is a diagram illustrating an equivalent circuit of the memory element according to a third example.

In the case where the switch element of the second example is designated by symbols of a switch and a diode, the memory element can be expressed by an equivalent circuit shown in FIG. 19. At this time, $V_4=0.5$ V. When the voltage shown in FIG. 19 was applied for input, deletion and reading with respect to a specified cell S, it was confirmed that the memory element operated as RAM (Random Access Memory).

MANUFACTURING OF THE MAGNETORESISTIVE EFFECT ELEMENT IN A FOURTH EXAMPLE

In the fourth example, the magnetoresistive effect element corresponding to the magnetoresistive effect element in the fourth embodiment was manufactured by the following method.

Similarly to the switch element in the first example, the aluminum layer was formed as the conductive layers 14a and 14b on the substrate 11, and two carbon nanotubes 12a and 12b where the cobalt particles are provided at their tip ends were manufactured. Since the magnetoresistive effect element does not have the high-doped semiconductor conductive layer (wiring) 41, this element is different from the switch element in the first example in that the Schottky joint is not formed between the aluminum layer and the high-doped semiconductor conductive (wiring) 41 and both the carbon nanotubes 12a and 12b use the aluminum layer as wiring.

Similarly to the switch element according to the first example, when a potential difference 0.6 V ($>V_{th}$) was applied between the aluminum layers (conductive layers 14a and 14b), it was firstly confirmed that the two carbon nanotubes 12a and 12b could be brought into contact with each other. Thereafter, an insulating layer which fills up the space between the carbon nanotubes 12a and 12b was manufactured. Titanic Oxide ($TiO_2$) was used as the insulating layer.

As to the magnetoresistive effect element in the fourth example, the insulating layer 61 was formed by using the following sol-gel method. First, a mixture of commercially available tetraisopropoxy titanium (15.0 g), ethyl acetylacetate (20.0 g) and water (2.5 g) was heated at 60° C. for 1 hour and then abruptly cooled, and ethyl acetylacetate (20.0 g) was added to the mixture so that a sol solution was synthesized. Thereafter, the voltage of 0.6 V was applied between the carbon nanotubes 12a and 12b, and the sol solution was applied with the carbon nanotubes 12a and 12b in the contact state with each other. The sol solution was dried for 2 minutes at heating temperature of 160° C. in argon atmosphere in order to prevent oxidation. The application thickness of the sol solution after drying was adjusted so as to become 300 nm.

Thereafter, the heating temperature was raised up to 300° C., and the sol solution was dried for 10 minutes, so that the titanium oxide ($TiO_2$) as the generated insulating layer 61 filled up the space between the carbon nanotubes 12a and 12b. The above steps were performed with the carbon nanotubes 12a and 12b being in the contact state because the sol solution naturally soaks through between the carbon nanotubes and the cobalt particles at the time of application, and thus, the very thin insulating layer 61 can be manufactured between the magnetic particles (cobalt particles) 13a and 13b.

Figure 20:
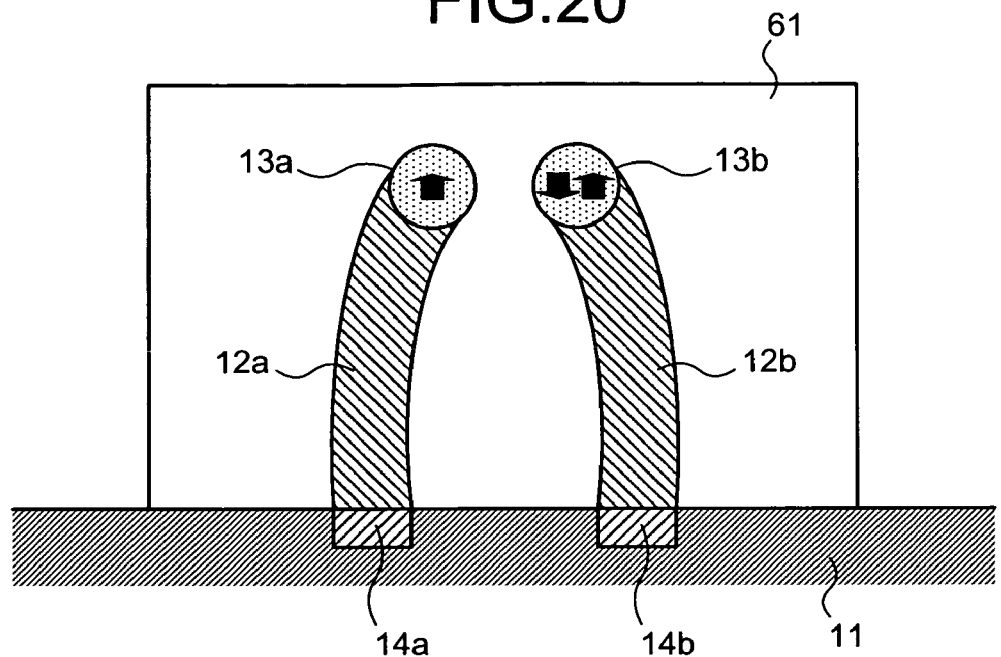
FIG. 20 is a sectional view typically illustrating a schematic constitution of a magnetoresistive effect element according to a fourth example.

According to the above method, the magnetoresistive effect element according to the fourth example shown in FIG. 20 was manufactured. FIG. 20 illustrates the space between the magnetic particles (cobalt particles) 13a and 13b comparatively widely in order to clarify the presence of the insulating layer 61 between the magnetic particles 13a and 13b.

CONFIRMATION FOR THE OPERATION OF THE MAGNETORESISTIVE EFFECT ELEMENT IN THE FOURTH EXAMPLE

Figure 21:
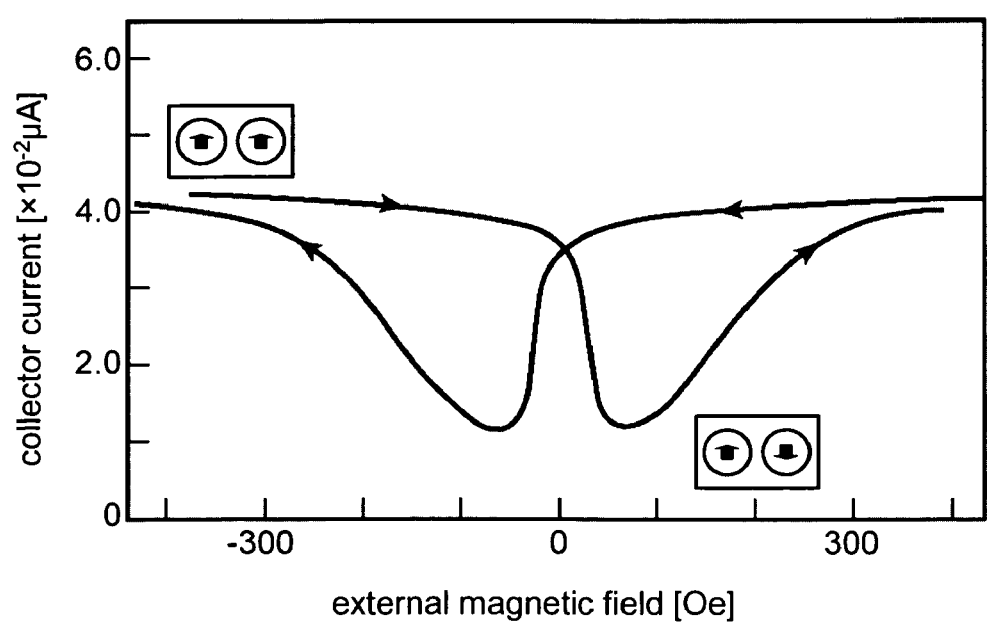
FIG. 21 is a characteristic diagram illustrating a relationship between a magnetic field and an electrical current in the magnetoresistive effect element according to the fourth example.

FIG. 21 shows a result of measuring a change in the electrical current at the time when an external magnetic field is changed with respect to the magnetoresistive effect element in the fourth example manufactured in the above manner. In FIG. 21, it is considered that when the electrical current is the lowest, the magnetizations of the magnetic particles (cobalt particles) 13a and 13b are opposite to each other due to the magnetic dipolar moment interaction. When the magnetic field is strengthened, the magnetizations of the magnetic particles (cobalt particles) 13a and 13b are aligned in the direction of the external magnetic field. For this reason, the tunnel probability between the magnetic particles (cobalt particles) 13a and 13b rises, so that the electrical current increases. When a ratio of the largest current value to the lowest current value was calculated, it was found that the magnetoresistive ratio of 100% or more was obtained. As a result, the magnetoresistive effect element which can obtain fine and very high magnetoresistive ratio can be realized, and thus the effectiveness of the magnetoresistive effect element according to the fourth example can be confirmed.

MANUFACTURING OF THE MAGNETORESISTIVE EFFECT ELEMENT IN A FIFTH EXAMPLE

In the fifth example, the magnetoresistive effect element corresponding to the magnetoresistive effect element in the fourth embodiment was manufactured similarly to the fourth example. In the manufacturing of the magnetoresistive effect element in the fifth example, silicon oxide ($SiO_2$) was used as an insulating layer 61. Further, a sol solution was synthesized in such a manner that a mixture including 15 g of tetraethoxysilane (TEOS), 1-butanol (5.0 g), 2-propanol (15.0 g), water (5.0 g) and nitric acid (0.06 g) was heated at 60° C. for 1 hour and was abruptly cooled, and 2-propanol (5.0 g) and 2-butanol (15.0 g) were added. Thereafter, the similar steps to the fourth example were executed, and the space between the carbon nanotubes 12a and 12b was filled up with silicon oxide ($SiO_2$). As a result, the magnetoresistive effect element in the fifth example having the carbon nanotubes 12a and 12b shown in FIG. 20 was formed.

CONFIRMATION FOR THE OPERATION OF THE MAGNETORESISTIVE EFFECT ELEMENT IN THE FIFTH EMBODIMENT

The magnetoresistive ratio of the magnetoresistive effect element in the fifth example manufactured in the above manner was measured similarly to the fourth example. The magnetoresistive ratio was about 50%, and it was found that this was inferior to that of the magnetoresistive effect element in the fourth example. This is because since band discontinuity of silicon oxide ($SiO_2$) with respect to cobalt is larger than that of the titanium oxide ($TiO_2$), magnetization dependency of the tunnel probability becomes small. As a result, it could be confirmed that the tunnel phenomenon is dominant in the magnetoresistive effect elements manufactured in the fourth and fifth examples.

The switch element according to the present embodiments is effective as the switch element to be used in the field of the electronic devices which require high quality and miniaturization.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A switch element comprising:
   a substrate;
   a plurality of carbon nanotubes provided upright on the substrate;
   magnetic particles arranged at tip ends of the carbon nanotubes respectively; and
   a plurality of conductive layers respectively formed between base ends of the carbon nanotubes and the substrate, wherein at least one of the conductive layers is insulated from the other conductive layers;
   wherein a switching operation is performed in such a manner that the carbon nanotubes or the magnetic particles are brought into contact with each other according to an electrical potential between the conductive layers, and the carbon nanotubes are separated from each other when an electrical current flows through the carbon nanotubes with the carbon nanotubes or the magnetic particles brought into contact with each other.

2. The switch element according to claim 1, wherein the magnetic particles are iron particles, nickel particles or cobalt particles.

3. A switch element comprising:
   a semiconductor substrate;
   a semiconductor conductive layer prepared by doping an impurity in a surface layer of the semiconductor substrate;
   a plurality of carbon nanotubes provided upright on the semiconductor conductive layer;
   magnetic particles arranged at tip ends of the carbon nanotubes respectively;
   a conductive layer formed between a base end of a part of the plurality of carbon nanotubes and the semiconductor conductive layer, insulated from the semiconductor conductive layer; and
   a magnetic conductive layer, whose magnetizing direction is fixed, formed between a base end of the rest of the plurality of carbon nanotubes and the semiconductor conductive layer, insulated from the conductive layer;
   wherein a switching operation is performed in such a manner that the carbon nanotubes or the magnetic particles are brought into contact with each other according to an electrical potential between the conductive layers, and the carbon nanotubes are separated from each other when an electrical current flows through the carbon nanotubes with the carbon nanotubes or the magnetic particles brought into contact with each other.

4. The switch element according to claim 3, wherein the semiconductor substrate is a silicon substrate, and further comprising a conductive protective layer which prevents silicifying of the magnetic conductive layer provided between the semiconductor conductive layer and the magnetic conductive layer.

5. The switch element according to claim 3, wherein a Schottky diode is formed by the magnetic conductive layer or the protective layer, and the semiconductor conductive layer.

6. The switch element according to claim 3, wherein the magnetic particles are iron particles, nickel particles or cobalt particles.

7. A memory element comprising:
   a plurality of the switch elements according to claim 1.

8. A memory element comprising:
   a plurality of the switch elements according to claim 3.

9. A magnetoresistive effect element comprising:
   a substrate;
   a plurality of carbon nanotubes provided upright on the substrate;
   magnetic particles arranged at tip ends of the carbon nanotubes respectively;
   a plurality of conductive layers formed between base ends of the carbon nanotubes and the substrate; and
   an insulating layer intervened between the carbon nanotubes;
   wherein a change in an external magnetic field is detected by sensing a tunnel current flowing between the conductive layers via the insulating layer.

* * * * *